(12) United States Patent
Sekigawa et al.

(10) Patent No.: US 8,537,603 B2
(45) Date of Patent: Sep. 17, 2013

(54) SRAM CELL

(75) Inventors: Toshihiro Sekigawa, Tsukuba (JP); Yohei Matsumoto, Tsukuba (JP); Hanpei Koike, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 94 days.

(21) Appl. No.: 13/384,648

(22) PCT Filed: Jul. 2, 2010

(86) PCT No.: PCT/JP2010/004354
§ 371 (c)(1), (2), (4) Date: Jan. 18, 2012

(87) PCT Pub. No.: WO2011/013298
PCT Pub. Date: Feb. 3, 2011

(65) Prior Publication Data
US 2012/0120717 A1 May 17, 2012

(30) Foreign Application Priority Data
Jul. 29, 2009 (JP) .................. 2009-176403

(51) Int. Cl.
*G11C 11/41* (2006.01)
*G11C 11/412* (2006.01)

(52) U.S. Cl.
USPC .............. 365/156; 365/63; 365/72; 365/154

(58) Field of Classification Search
USPC ........................................... 365/156
See application file for complete search history.

(56) References Cited

U.S. PATENT DOCUMENTS

| | | | |
|---|---|---|---|
| 6,853,578 B1 | 2/2005 | Zhang et al. | |
| 7,061,055 B2 | 6/2006 | Sekigawa et al. | |
| 7,295,459 B2 * | 11/2007 | Islam | 365/156 |
| 7,388,774 B1 * | 6/2008 | Kim | 365/154 |
| 2002/0130354 A1 | 9/2002 | Sekigawa et al. | |

FOREIGN PATENT DOCUMENTS

| | | |
|---|---|---|
| JP | 08-161890 A | 6/1996 |
| JP | 2000-243087 A | 9/2000 |
| JP | 2004-335535 A | 11/2004 |
| JP | 2005-251873 A | 9/2005 |
| JP | 2005-260607 A | 9/2005 |
| JP | 2006-166384 A | 6/2006 |
| JP | 2006-295653 A | 10/2006 |
| JP | 2008-176910 A | 7/2008 |
| JP | 2008-198242 A | 8/2008 |
| JP | 2008-293591 A | 12/2008 |
| JP | 2009-038076 A | 2/2009 |
| JP | 2009-151844 A | 7/2009 |

* cited by examiner

*Primary Examiner* — Tan T. Nguyen
(74) *Attorney, Agent, or Firm* — Bacon & Thomas, PLLC

(57) ABSTRACT

The present invention provides an SRAM cell which does not have the constraints on the size of transistors in order to realize stabilized write and read operations, which has a fewer number of control signal lines per port, and which can be easily multi-ported in the read operation as well as the write operation so that the write and read operations can be performed through a single bit line. The SRAM cell includes a feedback control transistor for controlling connection or disconnection of a positive feedback circuit between particularly two inverters, a write control transistor and a read control transistor connected to a single bit line, and a read buffer transistor connected to the read control transistor.

20 Claims, 10 Drawing Sheets

(a)

(b)

SRAM CELL

BACKGROUND OF THE INVENTION

1. Field of the Invention

The present invention relates to an SRAM (Static Random Access Memory) cell that performs read and write operations through a single bit line.

2. Description of the Related Art

In the present application, a nodal point between circuits in an electric circuit network will be referred to as a node. Naturally, one node may fulfill two different roles. In other words, assumed that a partial circuit network having a specified function in a single circuit network is referred to as a partial circuit, when an electric signal is output from the partial circuit to a node (output signal node), this node may be recognized as a node into which an electric signal is input (input signal node) if seen from a different partial circuit connected to the node. In addition, a wiring for supplying current to a circuit is referred to as a power supply line, while a wiring to which the current having passed through the circuit is fed back from the power supply line is referred to as a power feedback line. Moreover, a terminal is used herein to refer to an electrode provided to establish external electric connections for circuit elements, such as transistors, resistors, and capacitors, used in the circuit. Electrically, the terminal may double as the node.

An electric circuit network is referred to as a logic device, which electrically performs the logical manipulation by corresponding logic values to two different values representative of the electric signals, e.g. high and low levels of signal amplitude. The electric signal in that case is referred to as a logic signal, having an either logic value 1 or 0, corresponding to the high level (H) or low level (L), respectively. The logic signal may be referred to simply as data. The electric signal for controlling electric operation of the electric circuit or an active device used therein is referred to as a control signal. The logic signal may double as the control signal. The wiring concerned with the control signal is referred to as a control signal line, while the wiring concerned with the logic signal is referred as a data line.

A transistor is one of embodied examples of an electric switch which has at least one control signal input terminal and at least two signal output terminals and which controls conducted/non-conducted state between two output terminals by means of the control signal. Such a transistor includes generally an insulated gate field effect transistor (MOST), a bipolar transistor (BET), and the like. For the MOST, a gate thereof is used as the control signal input terminal, while a drain and a source thereof are used as the two signal output terminals. For the BPT, a base thereof is used as the control signal input terminal, while a collector and an emitter thereof are used as the two signal output terminals.

In addition, an inverter is an electric circuit having signal input and output terminals, and is also a logic device capable of electrically performing the logical manipulation, in which the signal output terminal outputs an inverse logic signal of a logic signal applied to the signal input terminal. Of course, it operates while connected to the power supply line and the power feedback line.

The present invention will be described hereinafter exemplifying the case where the MOST is used as the transistor. An example of an SRAM cell using the MOST is a dual bit line SRAM cell 10 shown in FIG. 1. The term "bit line" herein refers to the data line, or a wiring through which input/output (writing/reading) of logic signals (data) of memory contents into/from the SRAM cell is performed. The term "dual" represents that there are two bit lines and that the logic signals passing therethrough simultaneously are inverse from each other. The bit lines include a write-only bit line, a read-only bit line, and a bit line that performs the both.

In FIG. 1, an inverter 12 is configured by a P-type MOST (PMOST) 20 and an N-type MOST (NMOST) 22 having each drain connected to an output signal node Q1, each gate electrode to an input signal node I1, a source of the PMOST 20 to a power supply line VDDL at a node VD1, and a source of the NMOST 22 to a power feedback line VSSL at a node VS1. Similarly, an inverter 14 is configured by a PMOST 24 and an NMOST 26 having each drain connected to an output signal node Q2, each gate to an input signal node I2, a source of the PMOST 24 to a power supply line VDDL at a node VD2, and a source of the NMOST 26 to a power feedback line VSSL at a node VS2. An inverter configured by the PMOST and the NMOST as described above is referred to as a CMOS inverter.

Then, the output signal node Q1 of the inverter 12 is connected to the input signal node I2 of the inverter 14, while the output signal node Q2 of the inverter 14 is connected to the input signal node I1 of the inverter 12, so that a positive feedback circuit (or a latch circuit) is configured. In addition, the output signal node Q2 of the inverter 14 is connected to a source (or a drain) of an NMOST 16 serving as an access transistor (a control transistor used for both read operation and write operation), the drain (or the source) of the NMOST 16 is connected to a bit line BL at a node D1, the output signal node Q1 of the inverter 12 is connected to a source (or a drain) of an NMOST 18 serving as another access transistor, the drain (or the source) of the NMOST 18 is connected to a bit line BLB at a node D2, and gates of the NMOSTs 16 and 18 are connected to word lines WL at nodes P1 and P2, respectively. In this way, a single SRAM cell is configured. The bit lines BL and BLB are complementary to each other, that is, potentials thereof when seen as the logic signals are inverse from each other. Logic signal levels of the output signal nodes Q1 and Q2 are also complementary to each other at a steady state (when one is at the high level H, the other is at the low level L). For example, the memory contents are determined such that, when the output signal node Q1 of the inverter 12 is at the low level and the output signal node Q2 of the inverter 14 is at the high level, a logic 1 is stored, or in the inverse status, a logic 0 is stored, and the like. The NMOSTs 16 and 18 are used as a read control transistor for reading the memory contents of the SRAM cell out to the bit lines BL and BLB, or as a write control transistor for writing the logic signals of the bit lines BL and BLB into the SRAM cell. Moreover, the logic signal level of the SRAM cell may be inconsistent with the logic signal level of a logic circuit external to the memory device using the same.

An SRAM device configured by an array of the SRAM cells is required to be capable of performing high-speed operation and having large storage capacity. Therefore, it is desired to reduce the area of the SRAM cells, or miniaturize the size of each transistor as much as practically possible. However, it is impossible to minimize all the transistors due to the requirements to prevent malfunctioning of the memory contents in the SRAM cell to be inverted when read out, or to ensure the memory contents to be written correctly. Thus, the channel lengths of the NMOSTs 22 and 26 of the inverter are made to be substantially minimum (the channel widths are usually made to be wider than the minimum size in consideration of the area and the operation speed), and the access transistors 16 and 18 are made to have less current drive capacity (e.g. the channel widths are narrowed, the channel lengths are extended, or both) while having more current drive capacity than those of the PMOST 20 of the inverter 12 and the PMOST 24 of the inverter 14 (e.g. the channel lengths of the PMOSTs 20 and 24 are extended than those of the access transistors 16 and 18, the channel widths thereof are narrowed than those, or both). Here, in consideration of the constraint that the channel width cannot be narrowed less than the feasible minimum size, the channel width of each transistor must be set to be wider than the minimum size. This results in the increase in the area of the SRAM cell and in the stray capacitance, leading to the decrease in the operation speed of the SRAM cell.

Patent Document 1 listed below discloses the circuit shown in FIG. 2 as a conventional SRAM cell without the size constraints imposed on each transistor configuring the SRAM cell described above.

In FIG. 2, a first inverter 32 is configured by a P-type MOST (PMOST) 40 and an N-type MOST (NMOST) 42 having each drain connected to an output signal node Q42, each gate electrode to an input signal node I42, a source of the PMOST 40 to a power supply line VDDL at a node VD42, and a source of the NMOST 42 to a power feedback line VSSL at a node VS42. Similarly, a second inverter 34 is configured by a PMOST 44 and an NMOST 46 having each drain connected to an output signal node Q44, each gate electrode to an input signal node I44, a source of the PMOST 44 to a power supply line VDDL at a node VD44, and a source of the NMOST 46 to a power feedback line VSSL at a node VS44. Moreover, the output signal node Q42 of the first inverter 32 is connected to the input signal node I44 of the second inverter 34, the output signal node Q44 of the second inverter 34 is connected to a drain (or a source) of a PMOST 50 serving as a feedback control transistor, and the source (or the drain) of the PMOST 50 is connected to the input signal node I42 of the first inverter 32, so that the positive feedback circuit (or the latch circuit) is configured when the PMOST 50 is in the conducted state. In addition, a gate of the PMOST 50 is connected to a word line CWL for supplying a feedback circuit control signal at a node P10, the input signal node I42 of the first inverter 32 is connected to a source (or a drain) of an NMOST 52 serving as a write control transistor, the drain (or the source) of the NMOST 52 is connected to a single bit line BL at a node D8, and a gate electrode thereof is connected to a write control signal line WWL for supplying a write control signal at a node P8. Moreover, the output signal node Q44 of the second inverter 34 is connected to a source (or a drain) of an NMOST 54, the drain (or the source) of the NMOST 54 is connected to the above-mentioned bit line BL at a node D9, and a gate electrode of the NMOST 54 is connected to a read control signal line RWL for supplying a read control signal at a node P9. A control circuit 60 controls appropriately the potentials of a decoder circuit for selecting the cell, the WWL line, the CWL line, or the RWL line to generate the control signals thereof.

Hereinafter, schematic operation will be described in simulations, in which the high level of the logic signal in the SRAM cell represents a potential VDD of the power supply line VDDL while the low level thereof represents a potential (ground, GND, 0 V) of the power feedback line VSSL.

FIG. 3 shows a circuit diagram of the conventional SRAM cell used in the simulations, in which a sense circuit is omitted for simplicity of description. The value of VDD is set to 0.7 V.

Although a storage device using the SRAM cells performing the write and read operations through a single bit line, as shown in FIG. 2, requires a measure against the malfunction due to noise voltage induced in the bit line, the so-called open bit line architecture can be employed as the measure, as with 1-capacitor DRAM cells. In FIG. 3, an inverter 86 (partial circuit surrounded by the dotted line) is configured by a PMOST 70 and an NMOST 72, and an inverter 88 (partial circuit surrounded by the dotted line) is configured by a PMOST 74 and an NMOST 76, where an output signal node of the inverter 86 and an input signal node of the inverter 88 are connected with each other. This node is referred to as Vcellhold. An input signal node of the inverter 86 and an output signal node of the inverter 88 are referred to as Vcellwrite and Vcellread, respectively, which are connected through an NMOST 84 serving as a feedback control transistor. The conducted/non-conducted state of the NMOST 84 is determined by a control signal Vfbcont applied to a gate thereof. The nodes Vcellread and Vcellwrite are connected to a single bit line BL through an NMOST 80 as the read control transistor and an NMOST 82 as the write control transistor, respectively. The conducted/non-conducted state of the NMOSTs 80 and 82 is determined by control signals Vwrl and Vwwl, respectively, applied to each gate electrode terminal. The bit line BL is connected with a load capacitor Cbit, assuming that a number of cells of other rows in the storage device array are connected therewith, and the potential thereof is controlled by a bit line potential control signal source Vbitsource through an NMOST 90. A gate electrode terminal of the NMOST 90 is applied with a control signal Vbitscont, so that the bit line BL can be set to the high impedance state (where the discharging/charging of charges is highly limited) by switching the NMOST 90 to the non-conducted state. Note that the node symbols also represent symbols of a signal waveform of the node.

In the simulations, conventional double insulated gate field effect transistors are used, where two gates of each one are connected commonly for three-terminal operation, as shown in a schematic diagram of FIG. 4. In FIG. 4, reference numeral 91 denotes a substrate, 92 denotes an insulator, 93 denotes a source region, 94 denotes a drain region, 95 denotes a channel region, 96-1 denotes a first gate oxide, 96-2 denotes a second gate oxide, 97 denotes a first gate, 98 denotes a second gate, and 99 denotes an insulator.

First, FIGS. 5 and 6 show simulation results of the write operation of the conventional SRAM cell in FIG. 2. FIG. 5 shows the control signal waveform of the write operation, and FIG. 6 shows the signal waveform of each node of the SRAM cell at that time.

Table 1 shows sample values of the control signal waveform of the write operation in FIG. 5. In FIG. 5, the horizontal axis represents Time (s: seconds) and the vertical axis represents Signal Swing (V).

The symbol Δ represents characteristics of Vfbcont (a signal of the feedback control signal line CWL; i.e. the feedback control signal); and the symbol • represents characteristics of Vwwl (a signal of the write control signal line WWL; i.e. the write control signal).

The characteristics shown in FIG. 5 prove that Vfbcont and Vwwl exhibit consistent values alternately in the temporal basis.

Table 2 shows sample values of the signal waveform of each node of the SRAM cell in the write operation. In FIG. 6, the horizontal axis represents Time (s: seconds) and the vertical axis represents Signal Swing (V).

The symbol − represents characteristics of Vcellhold (hold voltage of the cell; i.e. the output node voltage of the first inverter);

the symbol + represents characteristics of Vcellwrite (write voltage of the cell; i.e. the input node voltage of the first inverter);

the solid line represents characteristics of Vcellread (readout voltage of the cell; i.e. the output node voltage of the second inverter); and the symbol * represents characteristics of Vbitline (bit line voltage).

TABLE 1

| Time (s) | Vfbcont (V) | Vwwl (V) |
|---|---|---|
| 1.10E−10 | 1.4 | 0 |
| 1.20E−10 | 1.4 | 0 |
| 1.40E−10 | 0 | 0 |
| 1.60E−10 | 0 | 0 |
| 1.80E−10 | 0 | 1.4 |
| 2.80E−10 | 0 | 1.4 |
| 3.00E−10 | 0 | 0 |
| 3.20E−10 | 0 | 0 |
| 3.40E−10 | 1.4 | 0 |
| 5.60E−10 | 1.4 | 0 |
| 5.80E−10 | 0 | 1.4 |
| 7.40E−10 | 1.4 | 0 |
| 8.00E−10 | 1.4 | 0 |

TABLE 2

| Time (s) | Vcellhold (V) | Vcellwrite (V) | Vcellread (V) | Vbitline (V) |
|---|---|---|---|---|
| 1.10E−10 | 0.7 | 1.13E−06 | 9.35E−07 | 0.690604 |
| 1.20E−10 | 0.7 | 1.13E−06 | 9.31E−07 | 0.693858 |
| 1.45E−10 | 0.700197 | −0.128133 | −0.000107675 | 0.697646 |
| 1.61E−10 | 0.702212 | −0.118844 | 0.000723142 | 0.698765 |
| 1.72E−10 | 0.751838 | 0.358484 | 7.86E−05 | 0.696661 |
| 1.79E−10 | 0.154256 | 0.662452 | 0.00242304 | 0.69571 |
| 2.80E−10 | 2.13E−06 | 0.699907 | 0.699999 | 0.699913 |
| 3.06E−10 | −7.73E−05 | 0.561946 | 0.700068 | 0.698713 |
| 3.41E−10 | 0.00036077 | 0.754876 | 0.734651 | 0.699661 |
| 3.63E−10 | −8.64E−05 | 0.700355 | 0.700236 | 0.699857 |
| 3.76E−10 | 2.34E−06 | 0.699991 | 0.699994 | 0.699912 |
| 4.20E−10 | 1.61E−07 | 0.7 | 0.7 | 0.699985 |
| 5.60E−10 | 0.00019471 | 0.527394 | 0.699999 | 0.000119781 |
| 5.92E−10 | 0.699263 | 0.00448964 | 0.000158091 | 0.00411228 |
| 7.07E−10 | 0.699969 | −0.0859418 | 1.10E−05 | −0.00204778 |
| 7.76E−10 | 0.7 | −8.42E−07 | −5.46E−07 | −2.10E−05 |
| 7.94E−10 | 0.7 | −5.22E−07 | −3.13E−07 | −6.13E−06 |

The swing of the control signal is set to be higher than the VDD, or 1.4 V as an example. This serves for prevention of the threshold voltage fall-off of a signal level when transferring the signals of the respective controlling NMOSTs 80, 82 and 84. The NMOST 90 to control the potential of the bit line BL is in the conducted state. That is, the control signal Vbitscont is held at 1.4 V, the potential Vbitline of the bit line BL is dependent on the potential of the control power source Vbitsource, and the bit line BL is in the low impedance state (where the charging/discharging of charges is highly easily performed).

When the nodes Vcellwrite and Vcellread are at the low level (0 V) and thus the node Vcellhold is at the high level (0.7 V) (the state being considered that the memory contents are at the low level), the write operation is performed to invert the memory contents. In other words, Vbitline is charged to reach the high level (0.7 V) and then the feedback control signal Vfbcont is shifted from 1.4 V to 0.0 V, as shown in FIG. 5, to switch the NMOST 84 to the non-conducted state, so that the nodes Vcellwrite and Vcellread are disconnected from each other. Next, the write control signal Vwwl is shifted from 0.0 V to 1.4 V to switch the NMOST 82 to the conducted state, and the potential of Vbitline is transferred to the node Vcellwrite. In doing so, the potential of Vcellwrite is shifted from the low level to the high level, which in turn shifts the potential of Vcellhold to the low level and then shifts the potential of Vcellread to the high level. When these potentials are stabilized, the level of Vwwl is returned to 0.0 V to switch the NMOST 82 back to the non-conducted state, and the level of Vfbcont is returned to 1.4 V to switch the NMOST 84 back to the conducted state, so that the inverters 86 and 88 configure the latch circuit to establish a holding status of the memory contents. The holding status continues while Vfbcont is kept at 1.4 V. Such a state where the nodes Vcellwrite and Vcellread are at the high level (0.7 V) and thus the node Vcellhold is at the low level (0.0 V) is considered that the memory contents are at the high level.

Next, the memory contents at the high level are rewritten by the memory contents at the low level. First, the potential of Vbitline is shifted from the high level to the low level. Then, as with the write procedure described above, the feedback control signal Vfbcont is shifted from 1.4 V to 0.0 V to switch the NMOST 84 to the non-conducted state, so that the nodes Vcellwrite and Vcellread are disconnected from each other. Then, the write control signal Vwwl is shifted from 0.0 V to 1.4 V to switch the NMOST 82 to the conducted state, and the potential of Vbitline is transferred to the node Vcellwrite. In doing so, the potentials of the respective nodes Vcellwrite, Vcellhold, and Vcellread are inverted, as shown in FIG. 6, so that the memory contents at the low level are written.

As described above, the write operation and the memory holding operation are proved to be performed correctly. Next, the read operation will be described. Note that the NMOST 82 is in the non-conducted state during the read operation. In other words, the write control signal Vwwl is kept at 0.0 V.

FIG. 7 shows the signal waveform of each node when reading the memory contents held at the low level from the conventional SRAM cell in FIG. 2. In FIG. 7, the horizontal axis represents Time (s: seconds) and the vertical axis represents Signal Swing (V).

The symbol ◊ represents characteristics of Vcellhold (hold voltage of the cell);

the symbol □ represents characteristics of Vcellwrite (write voltage of the cell);

the symbol Δ represents characteristics of Vcellread (read voltage of the cell);

the symbol x represents characteristics of Vfbcont (a signal of the feedback control signal line CWL; i.e. the feedback control signal);

the symbol * represents characteristics of Vbitline (bit line voltage);

the symbol + represents characteristics of Vwrl (a signal of the read control signal line WRL; i.e. the read control signal);

the solid line with the symbol − represents characteristics of Vbitsource (voltage of the pulsed power supply for applying the potential of the bit line); and the dashed line with the symbol − represents characteristics of Vbitscont (gate voltage to be applied to the NMOST for controlling the connection status between the pulsed power supply for applying the potential of the bit line and the bit line).

Table 3 shows sample values of the signal waveform of each node.

TABLE 3

| Time (s) | Vcellhold (V) | Vcellwrite (V) | Vcellread (V) | Vfbcont (V) | Vbitline (V) | Vwrl (V) | Vbitsource (V) | Vbitscont (V) |
|---|---|---|---|---|---|---|---|---|
| 3.00E−10 | 0.7 | 3.45E−08 | 9.15E−08 | 1.4 | −3.86E−06 | 0 | 0 | 1.4 |
| 3.40E−10 | 0.7 | 2.52E−07 | 2.50E−07 | 1.4 | −2.78E−08 | 0 | 0 | 1.4 |
| 3.47E−10 | 0.7 | 6.99E−07 | 6.16E−07 | 1.4 | 0.0236468 | 0 | 0.11384 | 1.4 |
| 4.60E−10 | 0.7 | 1.01E−06 | 8.40E−07 | 1.4 | 0.349682 | 0 | 0.35 | 1.4 |
| 4.80E−10 | 0.7 | 9.94E−07 | 8.27E−07 | 1.4 | 0.336461 | 0 | 0.35 | 0 |
| 5.00E−10 | 0.7 | 1.01E−06 | 8.36E−07 | 1.4 | 0.336461 | 0 | 0.35 | 0 |
| 5.20E−10 | 0.699128 | −0.129384 | −0.0091538 | 0 | 0.336459 | 0 | 0.35 | 0 |
| 7.00E−10 | 0.70002 | −0.121109 | −2.05E−05 | 0 | 0.199212 | 0 | 0.35 | 0 |
| 7.20E−10 | 0.702563 | 0.0858083 | 0.0670115 | 1.4 | 0.199212 | 0 | 0.35 | 0 |
| 7.93E−10 | 0.699999 | 1.03E−06 | 8.48E−07 | 1.4 | 0.199211 | 0 | 0.35 | 0 |

First, assuming that the open bit line architecture is applied for sensing, the bit line BL is charged to reach VDD/2. After the potential thereof is stabilized, the control signal Vbitscont to control the potential of the bit line BL is shifted from 1.4 V to 0.0 V to switch the NMOST 90 to the non-conducted state, so as to set the bit line BL to the high impedance state. Then, the feedback control signal Vfbcont is shifted from 1.4 V to 0.0 V, as shown in FIG. 7, to switch the NMOST 84 to the non-conducted state, so that the nodes Vcellwrite and Vcellread are disconnected from each other. Next, the read control signal Vwrl is shifted from 0.0 V to 1.4 V to switch the NMOST 80 to the conducted state, so that the bit line BL and the node Vcellread are connected to each other. Since the NMOST 76 of the inverter 88 is in the conducted state, the node Vcellread is in the low impedance state. Thereby, the charges charged on the bit line BL are discharged through the NMOSTs 80 and 76, as shown in FIG. 7, and then the potential Vbitline thereof decreases from VDD/2. From the decreased potential, a sense amplifier can detect that the memory contents are at the low level. Here, the potential of the node Vcellread is 0.0 V initially and increases immediately after the read operation is initiated. Although the extent of increase is dependent on the ratio of impedances of the NMOSTs 80 and 76, it is clearly lower than the potential VDD/2 of the bit line BL, which is set at the initiation of the read operation. However, if the potential of the bit line BL increases further due to the noises not considered in the simulations so that the potential of the node Vcellread exceeds a logic threshold (approximately VDD/2) of the inverter 86, the memory contents would not be inverted because the nodes Vcellwrite and Vcellread are disconnected from each other. After the end of the read operation, the control signal is returned to 0.0 V and the NMOST 80 is switched back to the non-conducted state. Moreover, the feedback control signal Vfbcont is returned to 1.4 V, the NMOST 84 is switched back to the conducted state, and thus the SRAM cell returned to the memory holding status at the low level, so that the memory contents are not inverted.

FIG. 8 shows the signal waveform of each node when reading the memory contents held at the high level from the conventional SRAM cell in FIG. 2. In FIG. 8, the horizontal axis represents Time (s: seconds) and the vertical axis represents Signal Swing (V).

The symbol ◇ represents characteristics of Vcellhold (hold voltage of the cell);

the symbol □ drawn in front of the line represents characteristics of Vcellwrite (write voltage of the cell);

the symbol Δ represents characteristics of Vcellread (read voltage of the cell);

the dashed line with the symbol x represents characteristics of Vfbcont (a signal of the feedback control signal line CWL; i.e. the feedback control signal);

the symbol * represents characteristics of Vbitline (bit line voltage);

the dashed line with the symbol + represents characteristics of Vwrl (a signal of the read control signal line WRL; i.e. the read control signal);

the symbol □ drawn behind the line represents characteristics of Vbitsource (voltage of the pulsed power supply for applying the potential of the bit line); and the dashed line with the symbol − represents characteristics of Vbitscont (gate voltage to be applied to the NMOST for controlling the connection status between the pulsed power supply for applying the potential of the bit line and the bit line).

Table 4 shows sample values of the signal waveform of each node.

TABLE 4

| Time (s) | Vcellhold (V) | Vcellwrite (V) | Vcellread (V) | Vfbcont (V) | Vbitline (V) | Vwrl (V) | Vbits (V) | Vbits cont( |
|---|---|---|---|---|---|---|---|---|
| 3.00E−10 | −0.0027714 | 0.561452 | 0.700112 | 0 | 0.698393 | 0 | 0.7 | 1.4 |
| 3.23E−10 | 0.00418579 | 0.576831 | 0.70917 | 0.182249 | 0.699324 | 0 | 0.7 | 1.4 |
| 3.40E−10 | 0.0100483 | 0.764221 | 0.748415 | 1.4 | 0.699652 | 0 | 0.7 | 1.4 |
| 4.40E−10 | 2.17E−07 | 0.7 | 0.7 | 1.4 | 0.699994 | 0 | 0.7 | 1.4 |
| 5.10E−10 | 2.46E−07 | 0.7 | 0.7 | 1.4 | 0.363897 | 0 | 0.35 | 1.4 |
| 5.30E−10 | 2.46E−07 | 0.7 | 0.7 | 1.4 | 0.346281 | 0 | 0.35 | 0 |
| 5.60E−10 | 2.44E−07 | 0.7 | 0.7 | 1.4 | 0.34628 | 0 | 0.35 | 0 |
| 5.80E−10 | −0.0030362 | 0.526127 | 0.69274 | 1.22E−15 | 0.34628 | 0 | 0.35 | 0 |
| 6.00E−10 | −0.0060697 | 0.525239 | 0.479962 | 0 | 0.359023 | 1.4 | 0.35 | 0 |
| 7.00E−10 | 0.00060802 | 0.527965 | 0.531231 | 0 | 0.451267 | 1.4 | 0.35 | 0 |
| 7.20E−10 | 0.00058972 | 0.52796 | 0.692495 | 0 | 0.452931 | 0 | 0.35 | 0 |
| 7.56E−10 | 0.00019217 | 0.527797 | 0.699999 | 0 | 0.45293 | 0 | 0.35 | 0 |
| 7.80E−10 | 0.0115086 | 0.757583 | 0.744533 | 1.4 | 0.45293 | 0 | 0.35 | 0 |
| 8.00E−10 | −0.0001631 | 0.700669 | 0.700445 | 1.4 | 0.45293 | 0 | 0.35 | 0 |

After the potential of the bit line BL is stabilized at VDD/2, the control signal Vbitscont to control the potential of the bit line BL is shifted from 1.4 V to 0.0 V to switch the NMOST 90 to the non-conducted state, so as to set the bit line BL to the high impedance state. Then, the feedback control signal Vfbcont is shifted from 1.4 V to 0.0 V, as shown in FIG. 8, to switch the NMOST 84 to the non-conducted state, so that the nodes Vcellwrite and Vcellread are disconnected from each other. Next, the read control signal Vwrl is shifted from 0.0 V to 1.4 V to switch the NMOST 80 to the conducted state, so that the bit line BL and the node Vcellread are connected to each other. Since the PMOST 74 of the inverter 88 is in the conducted state and thus the node Vcellread is connected to the power source VDD, the bit line BL is charged further through the NMOST 80 and PMOST 74, as shown in FIG. 8, and then the potential Vbitline thereof increases from VDD/2. From the increased potential, the sense amplifier can detect that the memory contents are at the high level. Here, the potential of the node Vcellread is 0.7 V initially and decreases immediately after the read operation is initiated. The extent of decrease is dependent on the ratio of impedances of the NMOST 80 and the PMOST 74. However, if the potential decreases below the logic threshold of the inverter 86 due to the noises or the like, which is the situation that is not considered in the simulations, the memory contents would not be inverted because the nodes Vcellwrite and Vcellread are disconnected from each other. After the end of the read operation, the control signal is returned to 0.0 V and the NMOST 80 is switched back to the non-conducted state. Moreover, the feedback control signal Vfbcont is returned to 1.4 V, the NMOST 84 is switched back to the conducted state, and thus the SRAM cell returned to the memory holding status at the high level, so that it can be found that the memory contents are not inverted as well.

The read operation is also proved to be performed correctly as described above, while it is found that there is the possibility for improvements. The disadvantage is that the potential of the node Vcellwrite in FIGS. 7 and 8 decreases when the feedback control signal Vfbcont is shifted from 1.4 V to 0.0 V. The potential is shifted below zero temporarily in FIG. 7, and below the high-level potential VDD in FIG. 8. This is because the NMOST 84 is switched to the non-conducted state and thus the node Vcellwrite is set to the high impedance state, that is the state where there is no passage sufficient for the charges to be discharged/charged to hold the potential, resulting in the redistribution of the accumulated charges in order to meet the condition that, when one potential of the stray capacitance loaded on the node Vcellwrite is shifted, the stray capacitance accumulates the charges as well corresponding to the change in the potential. In other words, the amount of the charges accumulated in the stray capacitance between the gate of the NMOST 84 and the node Vcellwrite changes in response to the change in the potential of the gate terminal of the NMOST 84. Although the problems did not occur in the simulations, with the additional noises, the negative potential as with the case in FIG. 7 may cause the increase in leak current induced by the gate (so-called GIDL) or the failure of the gate oxide, and the potential decrease from the high level as with the case in FIG. 8 may cause the inversion of the memory contents. Therefore, it is desirable to realize the SRAM cell without these causes. It is also desirable to reduce the number of the control signal lines from three of them for a pair of read and write ports as can be seen in the SRAM cell of FIG. 2.

In FIG. 2, there is required the read control signal line RWL and the write control signal line WWL in the row direction of the SRAM storage device as well as the feedback control signal line CWL in the different row direction in order to control the feedback control transistor to be switched to the non-conducted state when the write and read operations are performed. However, if it is sufficient to reserve a noise margin only for the write operation, one of the control signal lines can be eliminated by replacing the feedback control transistor with a PMOST and connecting a gate electrode terminal thereof to the write control signal line WWL. This is because the feedback control transistor may be in the conducted state when the write control NMOST is in the non-conducted state, or vice versa. However, the feedback control PMOST is switched to the conducted state when the read operation is performed, so that the noise margin is lowered in the read operation. In other words, in the read operation, the potential change in the output signal node Q44 (Vcellread in FIG. 3) of the second inverter 34 directly causes the potential change in the input signal node I42 (Vcellwrite in FIG. 3) of the first inverter 32, leading to the increase in the risk to cause the inversion of the output of the first inverter 32 (the inverter 86 in FIG. 3), i.e. the inversion of the memory contents, due to the noises and the like. In order to avoid this to occur, Patent Document 2 discloses an SRAM cell 100 shown in FIG. 9 additionally including a read buffer configured by a read control transistor and a buffer transistor as well as a read-only bit line.

In the SRAM cell 100 in FIG. 9, an inverter 102 is configured by a PMOST 110 and an NMOST 112 having each drain connected to form an output signal node Q102, each gate to form an input signal node I102, a source of the PMOST 110 to a power supply line VDDL, and a source of the NMOST 112 to a power feedback line VSSL. Similarly, an inverter 104 is configured by a PMOST 114 and an NMOST 116 having each drain connected to form an output signal node Q104, each gate to form an input signal node I104, a source of the PMOST 114 to a power supply line VDDL, and a source of the NMOST 116 to a power feedback line VSSL. Moreover, the output signal node Q102 of the inverter 102 is connected to the input signal node I104 of the inverter 104, the output signal node Q104 of the inverter 104 is connected to a drain (or a source) of a PMOST 120 serving as a feedback control transistor, and the source (or the drain) of the PMOST 120 is connected to the input signal node I102 of the inverter 102, so that the positive feedback circuit (or the latch circuit) is configured when the PMOST 120 is in the conducted state. In addition, a gate of the PMOST 120 is connected to a write control signal line WWL, the input signal node I102 of the inverter 102 is connected to a source (or a drain) of an NMOST 122 serving as a write control transistor, and the drain (or the source) of the NMOST 122 is connected to a write-only bit line W-BL. Moreover, the output signal node Q102 of the inverter 102 is connected to a gate of an NMOST 124 serving as a buffer transistor, a source of the NMOST 124 is connected to the power feedback line VSSL, a drain of the NMOST 124 is connected to a source (or a drain) of an NMOST 126 serving as a read control transistor, the drain (or the source) of the NMOST 126 is connected to a read-only bit line R-BL, and a gate of the NMOST 126 is connected to a read control signal line RWL. A control circuit 130 provides appropriate control signals to a decoder circuit for selecting the cell, the WWL, or the RWL.

PRIOR ART DOCUMENTS

Patent Documents

Patent Document 1: JP 2009-151844 A
Patent Document 2: U.S. Pat. No. 6,853,578 B1
Patent Document 3: JP 3543117 B2
Patent Document 4: U.S. Pat. No. 7,061,055 B2

SUMMARY OF THE INVENTION

The SRAM cell 100 of FIG. 9 is characterized by having the pair of bit lines R-BL and W-BL (having a single read port and a single write port) and as less as two corresponding control signal lines for the read and write operations, and yet the large noise margin for each operation can be obtained concurrently. However, in consideration of the multi-porting (the configuration where the write or read operation of storage data can be performed concurrently in a plurality of different rows or words) that is desired in the SRAM storage device configured by an array of SRAM cells, for example, a plurality of pairs of the write-only bit line W-BL and the read-only bit line R-BL are required to enable the respective read and write operations to be performed concurrently in a plurality of words. It leads to a concern of the extreme increase in the number of wirings.

Although increasing the number of read-only bit lines is sufficient for the multi-porting of only the read operation, the write operation is limited to a single word basis. However, if the write operation can also be performed concurrently in a plurality of words, high-speed and multifunctional performance of the storage device can be realized.

The objects of the present invention is to overcome the disadvantages described above and to provide the SRAM cell that does not have the constraints on the size of transistors in order to realize the stabilized write and read operations, which has a fewer number of control signal lines per port, and which can be easily multi-ported in the read operation as well as the write operation so that the write and read operations can be performed through a single bit line, i.e. a single bit line can be used for either of the write and read operations.

In order to achieve the objects described above, the present invention employs the following solutions.

An SRAM cell according to the present invention includes: a feedback control transistor for controlling connection/disconnection of a positive feedback circuit between particularly two inverters; a write control transistor and a read control transistor connected to a single bit line; and a read buffer transistor connected to the read control transistor.

Moreover, the SRAM cell includes: a plurality of bit lines that can be shared in the write and read operations of memory contents; the corresponding number of pairs of control signal lines, each pair being configured by a single read control line and a single write control line; and the corresponding number of groups of transistors configured by a write control transistor, a read control transistor, and a buffer transistor, connected to each bit line and each component of each pair of control signal lines and corresponding to each bit line.

Furthermore, the SRAM cell includes: a plurality of bit lines that can be shared in the write and read operations of memory contents; a single feedback control line; the corresponding number of pairs of control signal lines, each pair being configured by a single read control line and a single write control line; the corresponding number of pairs of transistors connected to each bit line, the feedback control line, and each component of each pair of control signal lines, each pair of transistors being configured by a write control transistor and a read control transistor; a single buffer transistor; and a single feedback control transistor.

In other words, in an SRAM storage device configured by an array of SRAM cells, the SRAM cells for a multi-ported SRAM device are configured, in which various combinations of the concurrent read and write operations are possible for the SRAM cells in different row directions depending on the number of bit lines.

The specific solutions are as follows.

Configuration 1: An SRAM cell, comprising:
a single bit line (BL);
a pair of control signal lines corresponding to the bit line (BL) and including a single write control signal line (WWL) and a single read control signal line (RWL);
a feedback control transistor (220);
a write control transistor (222), a read control transistor (224), and a buffer transistor (226) having an inverse polarity of the feedback control transistor (220);
a first inverter (202) having an output signal node (Q202) and an input signal node (I202); and
a second inverter (204) having an output signal node (Q204) and an input signal node (Q204); wherein
the first and second inverters (202, 204) operate by each connecting with a power supply line (VDDL) and a power feedback line (VSSL),
the output signal node (Q202) of the first inverter (202) is connected to the input signal node (I204) of the second inverter (204), the output signal node (Q204) of the second inverter (204) and the input signal node (I202) of the first inverter (202) are connected through the feedback control transistor (220), the input signal node (1202) of the first inverter (202) and the bit line (BL) are connected through the write control transistor (222),
each gate of the feedback control transistor (220) and the write control transistor (222) is connected to the write control signal line (WWL),
a gate of the buffer transistor (226) is connected to the output signal node (Q204) of the second inverter (204), a source of the buffer transistor (226) is connected to the power feedback line (VSSL), a drain of the buffer transistor (226) and the bit line (BL) are connected through the read control transistor (224), and
a gate of the read control transistor (224) is connected to the read control signal line (RWL).

Configuration 2: An SRAM cell, comprising:
a plurality of bit lines (BL1, BL2);
a plurality of pairs of control signal lines, the number of the pairs corresponding to the number of the bit lines (BL1, BL2), each pair including a single write control signal line (WWL1, WWL2) and a single read control signal line (RWL1, RWL2);
a plurality of groups of transistors, the number of the group corresponding to the bit lines (BL1, BL2), each group including a feedback control transistor (320, 322), as well as a write control transistor (330, 332), a read control transistor (334, 336), and a buffer transistor (324, 326) having an inverse polarity of the feedback control transistor (320, 322);
a first inverter (302) having an output signal node (Q302) and an input signal node (I302); and
a second inverter (304) having an output signal node (Q304) and an input signal node (I304); wherein the first and second inverters (302, 304) operate by each connecting with a power supply line (VDDL) and a power feedback line (VSSL),
the output signal node (Q302) of the first inverter (302) is connected to the input signal node (I304) of the second inverter (304), the output signal node (Q304) of the second inverter (304) and the input signal node (I302) of the first inverter (302) are connected through a serial connection of all of the feedback control transistors (320, 322), the input signal node (I302) of the first inverter (302) and the bit lines (BL1, BL2) are connected through the corresponding write control transistors (330, 332),
each gate of the feedback control transistors (320, 322) and the write control transistors (330, 332) is connected to the corresponding write control signal lines (WWL1, WWL2), each gate of the buffer transistors (324, 326) is connected to the output signal node (Q304) of the second inverter (304), each source of the buffer transistors (324, 326) is connected to the power feedback line (VSSL), each drain of the buffer transistors (324, 326) and the corresponding bit lines (BL1, BL2) are connected through the corresponding read control transistors (334, 336), and each gate of the read control transistors (334, 336) is connected to the corresponding read control signal lines (RWL1, RWL2).

Configuration 3: An SRAM cell, comprising:
a plurality of bit lines (BL1, BL2, BL3);
a plurality of pairs of control signal lines, the number of the pairs corresponding to the number of the bit lines (BL1, BL2, BL3), each pair including a single write control signal line (WWL1, WWL2, WWL3) and a single read control signal line (RWL1, RWL2, RWL3);
a single feedback control line (CWL);
a feedback control transistor (420);
a buffer transistor (422);
a plurality of groups of transistors, the number of the group corresponding to the bit lines (BL1, BL2, BL3), each group including a write control transistor (430, 432, 434) and a read control transistor (424, 426, 428) having an inverse polarity of the feedback control transistor (420);
a first inverter (402) having an output signal node (Q402) and an input signal node (I402); and
a second inverter (404) having an output signal node (Q404) and an input signal node (I404); wherein
the first and second inverters (402, 404) operate by each connecting with a power supply line (VDDL) and a power feedback line (VSSL),
the output signal node (Q402) of the first inverter (402) is connected to the input signal node (I404) of the second inverter (404), the output signal node (Q404) of the second inverter (404) and the input signal node (I402) of the first inverter (402) are connected through the feedback control transistor (420),
a gate of the feedback control transistor (420) is connected to the feedback control line (CWL),
the input signal node (I402) of the first inverter (402) and each of the bit lines (BL1, BL2, BL3) are connected through the corresponding write control transistors (430, 432, 434), and
a gate of the buffer transistor (422) is connected to the output signal node (Q404) of the second inverter (404), a source of the buffer transistor (422) is connected to the power feedback line (VSSL), a drain of the buffer transistor (422) and each of the bit lines (BL1, BL2, BL3) are connected through the corresponding read control transistors (424, 426, 428), each gate of the read control transistors (424, 426, 428) is connected to each read control signal line (RWL1, RWL2, RWL3) of the corresponding pair of control signal lines.

Configuration 4: An SRAM cell, comprising:
a plurality of bit lines (BL1, BL2, BL3);
a pair of control signal lines, corresponding to at least one bit line (BL1) among the bit lines (BL1, BL2, BL3), including a single write control signal line (WWL1) and a single read control signal line (RWL1);
a write control signal line (WWL2) or a read control signal line (RWL2) corresponding to the other bit lines (BL2, BL3);
a single feedback control line (CWL);
a feedback control transistor (520);
write control transistors (530, 532) corresponding to the write control signal lines (WWL1, WWL2);
read control transistors (524, 526) corresponding to the read control signal lines (RWL1, RWL2);

a buffer transistor (522);
a first inverter (502) having an output signal node (Q502) and an input signal node (I502); and
a second inverter (504) having an output signal node (Q504) and an input signal node (I504); wherein
the first and second inverters (502, 504) operate by each connecting with a power supply line (VDDL) and a power feedback line (VSSL),
the output signal node (Q502) of the first inverter (502) is connected to the input signal node (I504) of the second inverter (504), the output signal node (Q504) of the second inverter (504) and the input signal node (I502) of the first inverter (502) are connected through the feedback control transistor (520),
a gate of the feedback control transistor (520) is connected to the feedback control line (CWL),
the input signal node (I502) of the first inverter (502) is connected to the bit lines (BL1, BL2) through the corresponding write control transistors (530, 532),
each gate of the write control transistors (530, 532) is connected to the corresponding write control signal line (WWL1, WWL2),
a gate of the buffer transistor (522) is connected to the output signal node (Q504) of the second inverter (504), a source of the buffer transistor (522) is connected to the power feedback line (VSSL), a drain of the buffer transistor (522) is connected to the bit lines (BL1, BL3) through the corresponding read control transistors (524, 526), and
each gate of the read control transistors (524, 526) is connected to the corresponding read control signal lines (RWL1, RWL2).

Configuration 5: The SRAM cell according to any one of the above-described configurations 1 to 4, wherein the first and second inverters (202, 302, 402, 502: 204, 304, 404, 504) are configured by a P-type field effect transistor (210, 310, 410, 510) and an N-type field effect transistor (212, 312, 412, 512).

Configuration 6: The SRAM cell according to the above-described configuration 5, wherein each transistor is a double insulated gate field effect transistor having a fin structure, connected commonly at two gate electrodes for three-terminal operation.

Configuration 7: The SRAM cell according to any one of the above-described configurations 1 to 4, wherein the feedback control transistor (220, 320, 322, 420, 520) is configured by a P-type field effect transistor, and the buffer transistor (226, 324, 326, 422, 522), the write control transistor (222, 330, 332, 430, 432, 434, 530, 532), and the read control transistor (224, 334, 336, 424, 426, 428, 524, 526) are configured by an N-type field effect transistor.

Configuration 8: The SRAM cell according to the above-described configuration 7, wherein each transistor is a double insulated gate field effect transistor having a fin structure, connected commonly at two gate electrodes for three-terminal operation.

In the configurations described above, the positive feedback circuit is disconnected in the write operation and thus the write operation of the memory contents is easily performed. In other words, the input signal node (the writing node) of the inverter for the write operation in the SRAM cell is in the high impedance state, so that the input signal can be applied to shift the output to the high level or the low level, as with the general inverters. For the read operation, the writing node does not become the high impedance state because the positive feedback circuit is established, and the read buffer transistor prevents the potential of the bit line from affecting the writing node, so that it is highly resistant to the noises. As such, there is no need to adjust the size of the read or write transistor for a transistor configuring the inverter in order to reserve the noise margin for the read operation. In addition, a single bit line can be used for performing both the write and read operations of data. Therefore, the high-performance SRAM device can be configured, which can prevent the extreme increase in the cell area when multi-ported, and which can concurrently realize various combinations of operations, such as concurrent read operations of data, concurrent write operations, a combination of the read operation in one cell and the write operation in the other, or the like. Moreover, the device has reduced constraints on the size of transistors and is easily designed, so that all the transistors configuring the SRAM cell can have the same and minimum size.

DETAILED DESCRIPTION OF THE EMBODIMENTS

Hereinafter, embodiments of the present invention will be described in detail with reference to the drawings.

Figure 10:
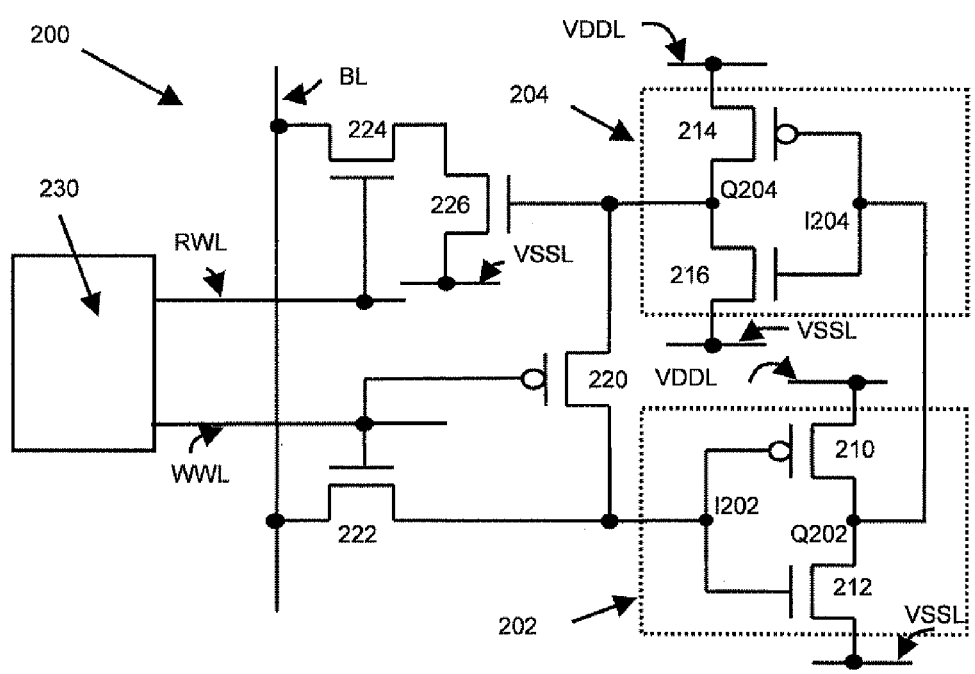
FIG. 10 shows a configuration diagram of an SRAM cell according to a first embodiment of the present invention.

FIG. 10 shows a configuration diagram of an SRAM cell according to a first embodiment of the present invention.

An SRAM circuit 200 has a single bit line BL, a single write control signal line WWL, and a single read control signal line RWL. A first inverter 202 is configured by a PMOST 210 and an NMOST 212 having each drain connected to form an output signal node Q202, each gate electrode to form an input signal node I202, a source of the PMOST 210 to a power supply line VDDL, and a source of the NMOST 212 to a power feedback line VSSL. Similarly, a second inverter 204 is configured by a PMOST 214 and an NMOST 216 having each drain connected to form an output signal node Q204, each gate electrode to form an input signal node I204, a source of the PMOST 214 to a power supply line VDDL, and a source of the NMOST 216 to a power feedback line VSSL. Moreover, the output signal node Q202 of the first inverter 202 is connected to the input signal node I204 of the second inverter 204, the output signal node Q204 of the second inverter 204 is connected to a drain (or a source) of a PMOST 220 serving as a feedback control transistor, and the source (or the drain) of the PMOST 220 is connected to the input signal node I202 of the first inverter 202, so that a positive feedback circuit (or a latch circuit) is configured when the PMOST 220 is in the conducted state. In addition, a gate of the PMOST 220 is connected to the write control signal line WWL, the input signal node I202 of the first inverter 202 is connected to a source (or a drain) of an NMOST 222 serving as a write control transistor, the drain (or the source) of the NMOST 222 is connected to the bit line BL, and a gate of the NMOST 222 is connected to the write control signal line WWL. Moreover, the output signal node Q204 of the second inverter 204 is connected to a gate of an NMOST 226 serving as a buffer transistor, a source of the NMOST 226 is connected to a power feedback line VSSL, a drain of the NMOST 226 is connected to a source (or a drain) of an NMOST 224 serving as a read control transistor, the drain (or the source) of the NMOST 224 is connected to the bit line BL, and a gate of the NMOST 224 is connected to the read control signal line RWL. A control circuit 230 controls appropriately potentials of a decoder circuit for selecting the cell, the write control signal line WWL, or the read control signal line RWL.

Next, the operations of the SRAM cell 200 will be described schematically. The circuit operation of the SRAM cell 200 is performed based on the read control signal line RWL and the write control signal line WWL from the control circuit 230.

First, assume that the SRAM cell 200 is not selected either for the read and write operations, that is, both the write control signal line WWL and the read control signal line RWL connected with the SRAM cell 200 are at a low potential (generally, same as the potential of the power feedback line VSSL) and the NMOST 222 and the NMOST 224 are in the non-conducted state. In this condition, the SRAM cell 200 is disconnected from the bit line BL and the PMOST 220 is in the conducted state, so that the positive feedback circuit is configured between the first inverter 202 and the second inverter 204 and thus the SRAM cell 200 is disconnected from an external circuit (a sense circuit, other SRAM cells, or the like) and in the holding status of memory contents.

Next, the write operation will be described. First, the potential of the bit line BL is set to a logic level corresponding to the contents to be written, i.e. either of the high level (VDDL potential) or the low level (VSSL potential), and to the low impedance state (where the bit line BL is normally connected to the power supply line VDDL or the power feedback line VSSL through a transistor in the conducted state or the like, and charging/discharging of charges is highly easily performed). Next, the potential of the write control signal line WWL is shifted to the high level so as to switch the NMOST 222 to the conducted state and the PMOST 220 to the non-conducted state. In this way, the logic level of the bit line BL is transferred to the input signal node I202 of the first inverter 202 through the NMOST 222, while the logic level of the output signal node Q202 of the first inverter 202 is at the inverse level. The logic level of the output signal node Q204 of the second inverter 204 is at the inverse level of the logic level of the output signal node Q202 of the first inverter 202. In other words, the logic levels of the output signal node Q204 of the second inverter 204 and the input signal node I202 of the first inverter 202 are at the same level. Here, when the bit line BL is at the high level, the level transferred to the input signal node I202 of the first inverter 202 decreases by the amount of threshold voltage of the NMOST 222, so that the value of the high potential of the write control signal line WWL may be set higher than the potential of the power supply line VDDL at least by that amount of the threshold voltage. Then, the potential of the write control signal line WWL is shifted to the low potential to switch the NMOST 222 to the non-conducted state and to switch the PMOST 220 to the conducted state, so as to establish the holding status of the written memory contents. During this transition, the memory contents to be written will not be inverted because the potential of the input signal node I202 of the first inverter 202 is held by the parasitic capacitance of a transistor or the like connected thereto.

Next, the read operation will be described. First, the potential of the bit line BL is shifted to the high level and then the bit line BL is inverted to the high impedance state (where the bit line BL is normally connected to the power supply line VDDL or the power feedback line VSSL through the transistor in the non-conducted state or the like, but the charging/discharging of charges is hardly enabled). Then, the potential of the read control signal line RWL is set to the high level to switch the NMOST 224 to the conducted state. At this time, if the output signal node Q204 of the second inverter 204 is at the high level, the NMOST 226 is in the conducted state. Thus, a discharging passage of the charges on the bit line BL is formed through the NMOSTs 224 and 226. Since the bit line BL is initially in the high impedance state and the additional charges are scarcely supplied, the potential thereof keeps decreasing. The decrease continues as long as the NMOST 224 is in the conducted state until it eventually reaches the potential level (low level) of the power feedback line VSSL. In contrast, if the output signal node Q204 of the second inverter 204 is at the low level, the NMOST 226 is in the non-conducted state and thus the discharging passage of the charges on the bit line BL is not formed, so that the potential of the bit line does not decrease. However, if the potential of the drain of the NMOST 226 is at the low level immediately before the read operation, the potential of the bit line BL decreases by the amount substantially determined by the ratio of the capacitance of the bit line BL and the capacitance of the drain of the NMOST 226, due to the so-called redistribution of the charges in which a portion of the charges on the bit line BL moves to the drain of the NMOST 226 through the NMOST 224, but does not decrease further. The memory contents can be read by the sense circuit configured by an inverter or the like to detect the difference in the potential change of the bit line BL as described above resulting from the memory contents being at the high or low level.

Figure 11:
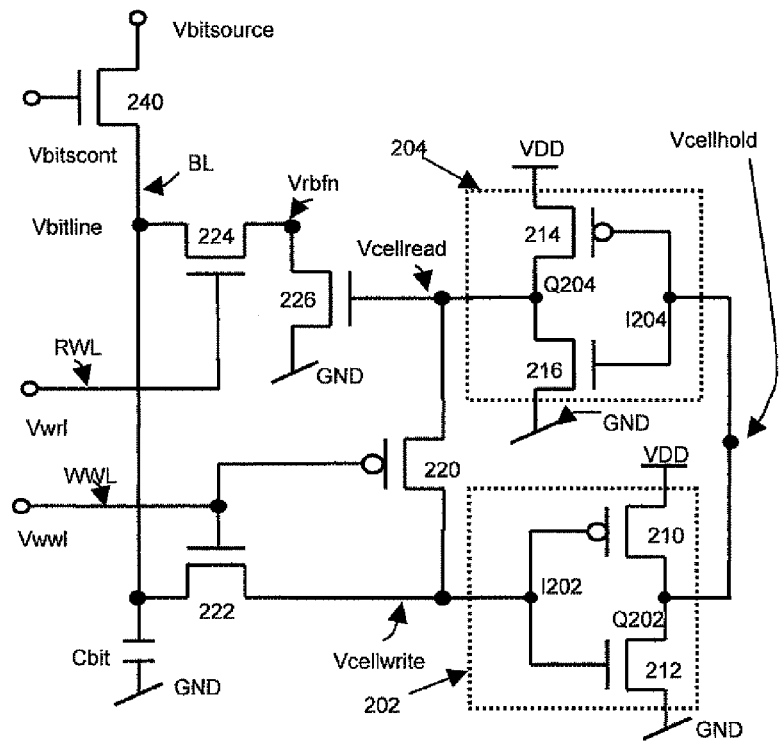
FIG. 11 shows a circuit diagram used in a simulation to verify operation, including the SRAM cell according to the first embodiment of the present invention.

FIG. 11 shows a circuit diagram used in a simulation to verify the operation, including the SRAM cell 200 according to the first embodiment of the present invention. In FIG. 11, the same reference numerals as those in the embodiment of FIG. 10 will not be described on the assumption that these elements provide the same configurations and functions. For convenience of description, the control circuit 230 and the sense circuit are omitted. The potential of the power supply line VDDL is set to VDD (0.7 V in the simulation) and the potential of the power feedback line VSSL is set to a ground potential GND (0.0 V). The bit line BL is connected to a pulse signal source through the NMOST 240. The signal of the pulse signal source is represented as Vbitsource. The signal of the bit line BL is represented as Vbitline. A gate of an NMOST 240 is connected with an independent pulse signal source which supplies a signal Vbitscont to control the NMOST 240 to switch between the conducted and non-conducted states (corresponding to the low and high impedance states of the bit line EL, respectively). The potential of the write control signal line WWL is driven by an independent pulse signal source, and the signal thereof is represented as Vwwl. Similarly, the potential of the read control signal wire RWL is driven by an independent pulse signal source, and the signal thereof is represented as Vwrl. Vcellwrite represents the signal of the input signal node I202 of the first inverter 202, Vcellhold represents the signal of the output signal node Q202 of the first inverter 202 and the input signal node I204 of the second inverter 204, Vcellread represents the signal of the output signal node Q204 of the second inverter 204, and Vrbfn represents the signal of the connection point between the drain of the NMOST 226 and the NMOST 224.

Figure 12:
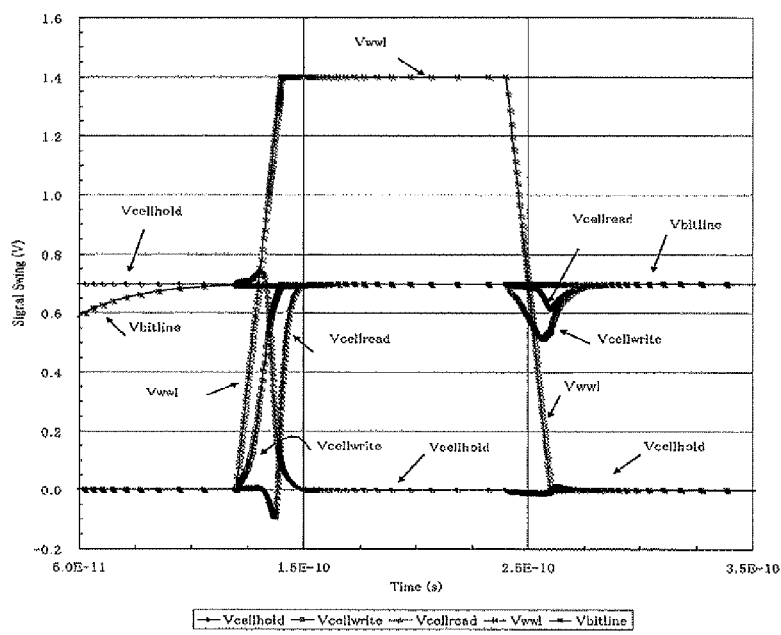
FIG. 12 shows a simulation result of write operation at a high level of the SRAM cell in FIG. 11 according to the present invention.

FIG. 12 shows a simulation result of the write operation at the high level of the SRAM cell in FIG. 11 according to the present invention. In FIG. 12, the horizontal axis represents Time (s: seconds) and the vertical axis represents Signal Swing (V).

The symbol ◊ represents characteristics of Vcellhold (hold voltage of the cell);

the symbol □ represents characteristics of Vcellwrite (write voltage of the cell);

the symbol Δ represents characteristics of Vcellread (read voltage of the cell);

the symbol * represents characteristics of Vbitline (bit line voltage); and the symbol x represents characteristics of Vwwl (a signal of the write control signal line WWL; i.e. the write control signal).

Table 5 shows sample values of the simulation result of FIG. 12.

TABLE 5

| Time (s) | Vcellhold (V) | Vcellwrite (V) | Vcellread (V) | Vwwl (V) | Vbitline (V) |
|---|---|---|---|---|---|
| 4.94E−11 | 0.7 | 1.97E−05 | 2.45E−07 | 0 | 0.58742 |
| 1.20E−10 | 0.7 | 3.93E−05 | 2.46E−07 | 0 | 0.693934 |
| 1.33E−10 | 0.720603 | 0.429115 | −0.0025517 | 0.88154 | 0.69484 |

TABLE 5-continued

| Time (s) | Vcellhold (V) | Vcellwrite (V) | Vcellread (V) | Vwwl (V) | Vbitline (V) |
|---|---|---|---|---|---|
| 1.40E−10 | 0.0912976 | 0.69716 | 0.310404 | 1.4 | 0.695212 |
| 1.61E−10 | 7.20E−05 | 0.697469 | 0.69992 | 1.4 | 0.697629 |
| 2.40E−10 | 2.55E−06 | 0.699891 | 0.699993 | 1.4 | 0.699897 |
| 2.60E−10 | −0.004325 | 0.541133 | 0.617167 | 0 | 0.698294 |

TABLE 5-continued

| Time (s) | Vcellhold (V) | Vcellwrite (V) | Vcellread (V) | Vwwl (V) | Vbitline (V) |
|---|---|---|---|---|---|
| 3.18E−10 | −3.10E−06 | 0.700016 | 0.700009 | 0 | 0.699819 |
| 3.39E−10 | −2.20E−07 | 0.700001 | 0.7 | 0 | 0.699921 |
| 3.52E−10 | 2.85E−07 | 0.699999 | 0.699999 | 0 | 0.699955 |

The SRAM cell is in the state where Vcellwrite and Vcellread are at the low level (0.0 V) and Vcellhold is at the high level (0.7 V), and the write operation is performed so as to invert the state. First, after the potential Vbitline of the bit line BL reaches the high level, the potential of the write control signal line WWL is set to the high level to switch the INMOST 222 to the conducted state, while the PMOST 220 is switched to the non-conducted state to disconnect the positive feedback circuit from the second inverter 204 to the first inverter 202 so that the first and second inverters 202 and 204 are simply cascaded. In doing so, the potential Vbitline of the bit line BL is transferred to the input signal node I202 of the first inverter 202 and the potential Vcellwrite of the input signal node I202 of the first inverter 202 is shifted to the high level. In turn, the potential Vcellhold of the output signal node Q202 of the first inverter 202 is shifted to the low level, and the potential Vcellread of the output signal node Q204 of the second inverter 204 is shifted to the high level. After each potential is stabilized, the potential of the write control signal line WWL is shifted to the low level to switch the NMOST 222 to the non-conducted state, while the PMOST 220 is switched to the conducted state to connect the positive feedback circuit from the second inverter 204 to the first inverter 202 to establish the holding status of the written contents. FIG. 12 clearly shows that, although transient minor potential drops are found, Vcellwrite and Vcellread are held at the high level while Vcellhold is held at the low level after the period that can be considered to be the steady state has passed.

Figure 13:
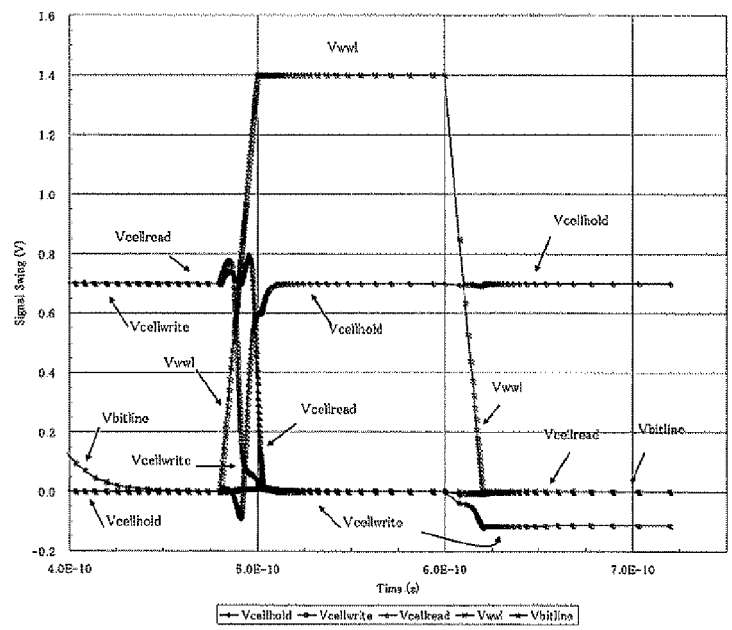
FIG. 13 shows a simulation result of write operation at a low level of the SRAM cell in FIG. 11 according to the present invention.

FIG. 13 shows a simulation result of the write operation at the low level of the SRAM cell in FIG. 11 according to the present invention. In FIG. 13, the horizontal axis represents Time (s: seconds) and the vertical axis represents Signal Swing (V).

The symbol ◇ represents characteristics of Vcellhold (hold voltage of the cell);
the symbol □ represents characteristics of Vcellwrite (write voltage of the cell);
the symbol Δ represents characteristics of Vcellread (read voltage of the cell);
the symbol * represents characteristics of Vbitline (bit line voltage); and
the symbol x represents characteristics of Vwwl (a signal of the write control signal line WWL; i.e. the write control signal).

Table 6 shows sample values of the simulation result of FIG. 13.

TABLE 6

| Time (s) | Vcellhold (V) | Vcellwrite (V) | Vcellread (V) | Vwwl (V) | Vbitline (V) |
|---|---|---|---|---|---|
| 3.99E−10 | 2.59E−07 | 0.699999 | 0.699999 | 0 | 0.123339 |
| 4.80E−10 | 2.44E−07 | 0.699999 | 0.699999 | 0 | 0.000430581 |
| 4.85E−10 | 0.00682704 | 0.77709 | 0.742863 | 0.342002 | 0.000735209 |
| 5.00E−10 | 0.600546 | 0.0389861 | 0.367701 | 1.4 | 0.00991114 |
| 6.00E−10 | 0.699999 | 5.55E−06 | 2.55E−07 | 1.4 | 5.21E−06 |
| 6.20E−10 | 0.692369 | −0.119705 | −0.00788038 | 0 | −0.00362592 |
| 7.20E−10 | 0.700008 | −0.114468 | 5.93E−08 | 0 | 1.12E−06 |

The SRAM cell is in the state where Vcellwrite and Vcellread are at the high level (0.7 V) and Vcellhold is at the low level (0.0 V), and the write operation is performed so as to invert the state. First, after the potential Vbitline of the bit line BL reaches the low level, the potential of the write control signal line WWL is set to the high level to switch the NMOST 222 to the conducted state, while the PMOST 220 is switched to the non-conducted state to disconnect the positive feedback circuit from the second inverter 204 to the first inverter 202 so that the first and second inverters 202 and 204 are simply cascaded. In doing so, the potential Vbitline of the bit line BL is transferred to the input signal node I202 of the first inverter 202 and the potential Vcellwrite of the input signal node I202 of the first inverter 202 is shifted to the low level. In turn, the potential Vcellhold of the output signal node Q202 of the first inverter 202 is shifted to the high level, and the potential Vcellread of the output signal node Q204 of the second inverter 204 is shifted to the low level. After each potential is stabilized, the potential of the write control signal line WWL is shifted to the low level to switch the NMOST 222 to the non-conducted state, while the PMOST 220 is switched to the conducted state to connect the positive feedback circuit from the second inverter 204 to the first inverter 202 to establish the holding status of the written contents. FIG. 13 clearly shows that Vcellwrite and Vcellread are held at the low level while Vcellhold is held at the high level. However, since the PMOST 220 at the low level exhibits the poor transfer efficiency, the PMOST 220 is in the high resistance state while not in the non-conducted state unless decreasing the potential of the write control signal line WWL below 0.0 V by its threshold voltage. As such, the impedance of the input signal node I202 of the first inverter 202 is higher than that of the output signal node Q204 of the second inverter 204 in the low impedance state. Therefore, when the holding status is established, the potential Vcellwrite of the input signal node I202 of the first inverter 202 is affected by the redistribution of the charges, resulting in the decrease in the potential to the level a little lower than the expected low level, 0.0 V. However, this does not cause the inversion of the memory contents or the like. In addition, if the potential of the input signal node I202 of the first inverter 202 increases due to the noises or the like, the increase by the amount of the absolute value of the threshold voltage of the PMOST 220 causes the PMOST 220 to turn into the low resistance state. As such, the connection to the output signal node Q204 of the second inverter 204 in the low impedance state is established to prevent further increase in the potential, so that the inversion of the memory contents is also prevented. By reducing the absolute value of the threshold voltage of the PMOST 220 to close to 0 V, or rather making it a positive value, the phenomenon described above is mitigated. In other words, the potential Vcellwrite of the input signal node I202 of the first inverter 202 can be kept close to the expected low level value, 0.0 V.

Figure 14:
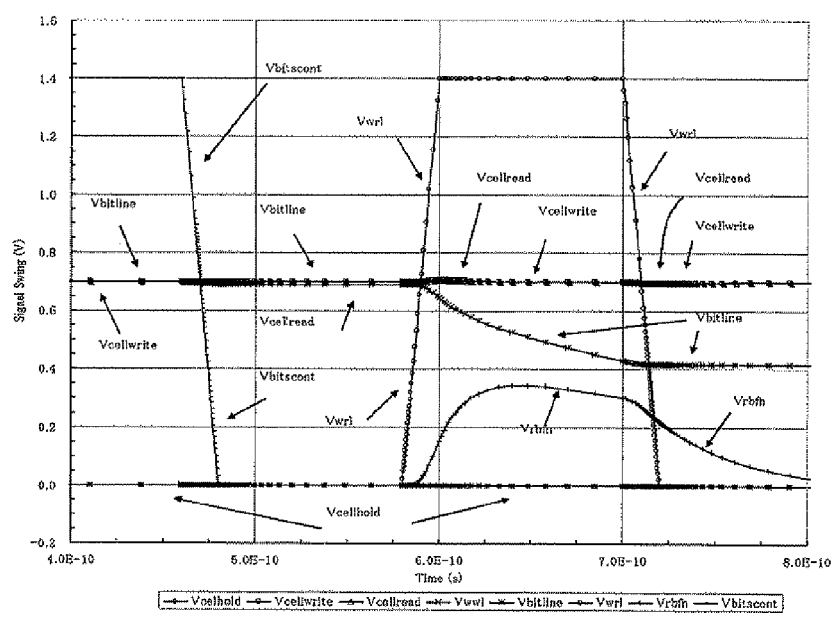
FIG. 14 shows a simulation result of read operation of the SRAM cell in FIG. 11, when a potential of an output signal node Q204 is held at the high level (0.7 V), according to the present invention.

FIG. 14 shows a simulation result of the read operation of the SRAM cell in FIG. 11, when the potential Vcellread of the output signal node Q204 of the second inverter 204 is held at the high level (0.7 V), according to the present invention. In FIG. 14, the horizontal axis represents Time (s: seconds) and the vertical axis represents Signal Swing (V).

The symbol ◊ represents characteristics of Vcellhold (hold voltage of the cell);

the symbol □ represents characteristics of Vcellwrite (write voltage of the cell);

the symbol Δ represents characteristics of Vcellread (read voltage of the cell);

the symbol * represents characteristics of Vbitline (bit line voltage);

the symbol x represents characteristics of Vwwl (a signal of the write control signal line WWL; i.e. the write control signal) (not indicated by an arrow);

the symbol ○ represents characteristics of Vwrl (a signal of the read control signal line WRL; i.e. the read control signal);

the symbol + represents characteristics of Vrbfn (drain voltage of the buffer transistor); and the symbol − represents characteristics of Vbitscont (gate voltage to be applied to the NMOST for controlling the connection status between the pulsed power supply for applying the potential of the bit line and the bit line).

Table 7 shows sample values of the simulation result of FIG. 14.

FIG. 14. Simultaneously, Vrbfn temporarily increases without exceeding Vbitline and eventually starts to decrease along with the decrease in Vbitline as shown in FIG. 14. This status continues as long as Vwrl is at the high potential, and both Vbitline and Vrbfn should be stabilized eventually at the GND level (0.0 V).

As shown in FIG. 14, by shifting Vwrl back to the low potential after a certain period of the high potential state, the discharging passage is eliminated so that Vbitline stops decreasing and keeps the value at that point. Meanwhile, the NMOST 226 is still in the conducted state and the parasitic capacitance of Vbrfn is lower than that of the bit line BL, so that Vbrfn decreases faster and further to eventually reach the GND level (0.0). After that, the holding status is established. However, FIG. 14 shows that Vcellread and Vcellwrite are held at the high level as with the status before the read operation and Vcellhold is held at the low level, so that the read operation here does not involve the inversion of the memory contents.

Figure 15:
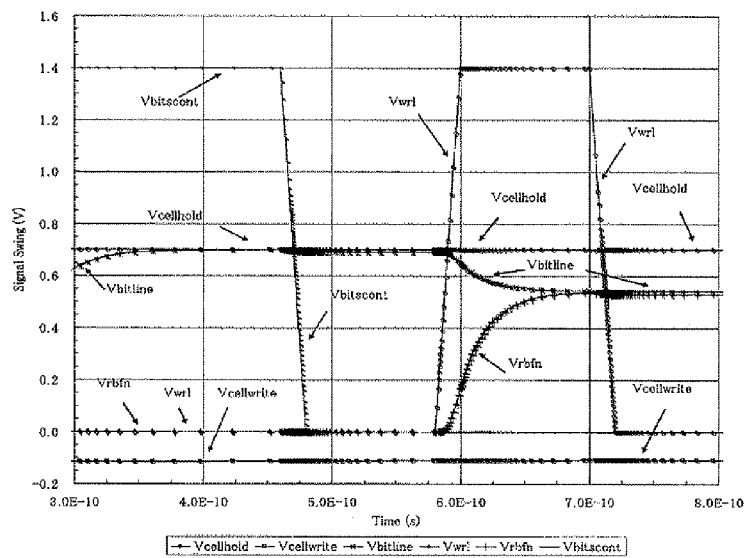
FIG. 15 shows a simulation result of read operation of the SRAM cell in FIG. 11, when the potential of the output signal node Q204 is held at the low level (0.0 V), according to the present invention.

FIG. 15 shows a simulation result of the read operation of the SRAM cell in FIG. 11, when the potential Vcellread of the output signal node Q204 of the second inverter 204 is held at the low level (0.0 V) and Vcellhold is held at the high level (0.7 V), according to the present invention. For simplicity of the figure, Vcellread is not shown because it is held at 0.0 V.

In FIG. 15, the horizontal axis represents Time (s: seconds) and the vertical axis represents Signal Swing (V).

The symbol ◊ represents characteristics of Vcellhold (hold voltage of the cell);

the symbol □ represents characteristics of Vcellwrite (write voltage of the cell);

TABLE 7

| Time (s) | Vcellhold (V) | Vcellwrite (V) | Vcellread (V) | Vbitline (V) | Vwrl (V) | VrbfnV) | Vbitscont( |
|---|---|---|---|---|---|---|---|
| 4.11E−10 | 2.53E−07 | 0.699999 | 0.699999 | 0.699998 | 0 | 7.70E−06 | 1.4 |
| 4.60E−10 | 2.44E−07 | 0.7 | 0.7 | 0.700001 | 0 | 1.47E−06 | 1.4 |
| 4.80E−10 | 2.45E−07 | 0.7 | 0.7 | 0.690416 | 0 | 9.97E−07 | 0 |
| 5.80E−10 | 2.44E−07 | 0.7 | 0.7 | 0.690416 | 0 | 3.81E−07 | 0 |
| 6.00E−10 | 0.000360395 | 0.706416 | 0.707132 | 0.646176 | 1.4 | 0.152648 | 0 |
| 7.00E−10 | 3.26E−08 | 0.699566 | 0.699566 | 0.43007 | 1.4 | 0.302955 | 0 |
| 7.20E−10 | −3.09E−05 | 0.697777 | 0.697716 | 0.417226 | 0 | 0.218565 | 0 |
| 7.90E−10 | 1.76E−05 | 0.699303 | 0.699339 | 0.417226 | 0 | 0.0391808 | 0 |

In this case, the NMOST 226 is in the conducted state and the potential Vrbfn of the drain thereof is at the low level (0.0 V). First, the bit line BL is set to the high level and then, after its potential is stabilized, Vbitscont is set to the low potential to switch the NMOST 240 to the non-conducted state and set the bit line BL to the high impedance state. Then, the potential Vwrl of the read control signal line WRL is set to the high potential to switch the NMOST 224 from the non-conducted state to the conducted state. In doing so, the discharging passage to the ground potential GND is formed through the NMOSTs 224 and 226. Since the bit line BL is initially in the high impedance state without the charging passage of the charges, its potential Vbitline starts to decrease as shown in the symbol ○ represents characteristics of Vwrl (a signal of the read control signal line WRL; i.e. the read control signal);

the symbol * represents characteristics of Vbitline (bit line voltage);

the symbol + represents characteristics of Vrbfn (drain voltage of the buffer transistor); and the symbol − represents characteristics of Vbitscont (gate voltage to be applied to the INMOST for controlling the connection status between the pulsed power supply for applying the potential of the bit line and the bit line).

Table 8 shows sample values of the simulation result of FIG. 15.

TABLE 8

| Time (s) | Vcellhold (V) | Vcellwrite (V) | Vcellread (V) | Vbitline (V) | VwrlV) | VrbfnV) | Vbitscont (V) |
|---|---|---|---|---|---|---|---|
| 2.99E−10 | 0.700011 | −0.115997 | 6.33E−08 | 0.625827 | 0 | 7.89E−07 | 1.4 |
| 4.60E−10 | 0.70001 | −0.113097 | 5.91E−08 | 0.700131 | 0 | 2.28E−06 | 1.4 |
| 4.80E−10 | 0.70001 | −0.112756 | 5.89E−08 | 0.690531 | 0 | 2.46E−06 | 0 |

TABLE 8-continued

| Time (s) | Vcellhold (V) | Vcellwrite (V) | Vcellread (V) | Vbitline (V) | VwrlV) | VrbfnV) | Vbitscont (V) |
|---|---|---|---|---|---|---|---|
| 5.81E−10 | 0.700016 | −0.111088 | 2.41E−05 | 0.690569 | 0.095 | 0.000303794 | 0 |
| 6.00E−10 | 0.700014 | −0.110795 | 0.00183176 | 0.647116 | 1.4 | 0.171315 | 0 |
| 7.00E−10 | 0.700008 | −0.109323 | 1.27E−05 | 0.541826 | 1.4 | 0.536968 | 0 |
| 7.20E−10 | 0.700009 | −0.109039 | −1.10E−05 | 0.539121 | 0 | 0.529422 | 0 |
| 7.96E−10 | 0.700008 | −0.107992 | 5.98E−08 | 0.53911 | 0 | 0.529421 | 0 |

In this case, the NMOST 226 is in the non-conducted state while the potential Vrbfn of the drain thereof is set to the low level (0.0 V). The reason is that the potential would reach a value very close to the low level due to the effect of leak current of the NMOST 226 if the holding status is held for a long period, and that the potential would also be at the low level if there is the history that the output signal node Q204 of the second inverter 204 has been shifted to the high level as described above. Now, the bit line BL is set to the high level and then, after its potential is stabilized, Vbitscont is set to the low potential to switch the NMOST 240 to the non-conducted state and set the bit line BL to the high impedance state. Then, the potential Vwrl of the read control signal line WRL is set to the high potential to switch the NMOST 224 from the non-conducted state to the conducted state. In this case, since the NMOST 226 is in the non-conducted state, the discharging passage from the bit line BL to the ground potential GND is not formed, so that the potential Vbitline of the bit line BL should not decrease. However, as shown in FIG. 15, the charges are supplied from the bit line BL to the drain of the NMOST 226 and the potential Vrbfn thereof keeps increasing. Simultaneously, the potential Vbitline decreases by the amount corresponding to the lost charges. Eventually, Vbitline and Vrbfn reach constant values that are substantially consistent with each other. This phenomenon is the so-called redistribution of the charges, in which the amount of decrease of Vbitline should be actually lower than that shown in FIG. 15 because the parasitic capacitance of the bit line is usually higher enough than the parasitic capacitance of the drain of the NMOST 226. In addition, as shown in FIG. 15, when Vwrl is shifted back to the low potential after a certain period of the high potential state, the bit line BL and the drain of the NMOST 226 remain in the high impedance state, so that Vbitline and Vrbfn are kept at the constant values that are substantially consistent with each other.

After that, the holding status is established. However, the value of Vrbfn does not affect the memory contents and thus, as FIG. 15 shows, Vcellhold is held at the high level before the read operation (while Vcellread is at the low level) so that the read operation here does not involve the inversion of the memory contents. Here, the reason that Vcellwrite exhibits a negative value is that the read operation here is performed after the read operation at the low level is performed as shown in FIG. 13, so that the input signal node I202 of the first inverter 202 and the output signal node Q204 of the second inverter 204 are connected in the high resistance state as described with reference to FIG. 13. As such, the inversion of the memory contents does not occur in the simulation. However, it is desired as described above to improve this status so as to shift Vcellwrite to the expected low level (0.0 V), and in order to do so, the possible measure includes lowering the absolute value of the threshold voltage of the PMOST 220 temporarily during in the holding status or constantly.

In the read operation described above, the memory contents can be determined by the sense circuit depending on the difference of the Vbitline value. For example, by connecting an input of the inverter having the same logic threshold as that of the inverter of the SRAM cell, an output thereof can be used for the determination.

Figure 16:
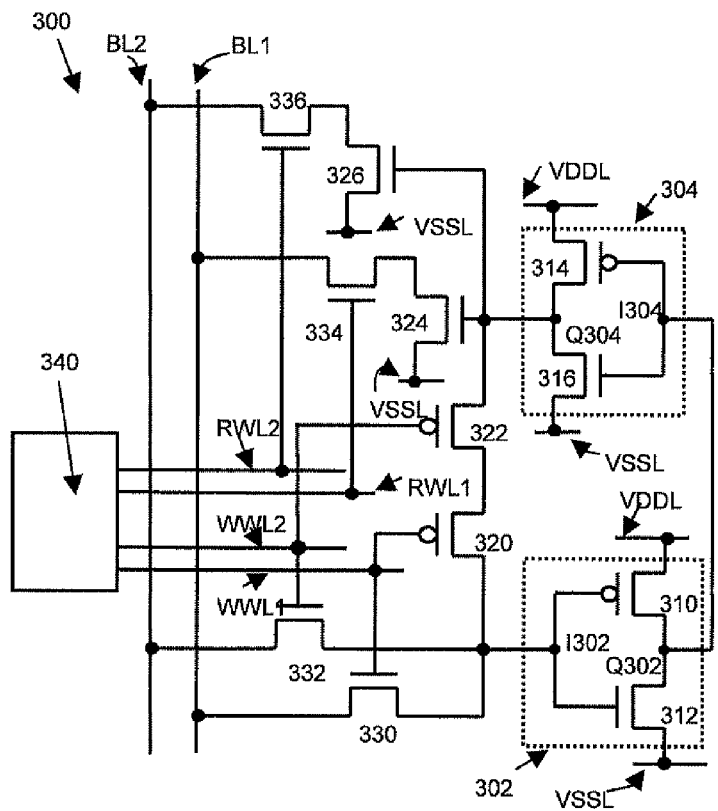
FIG. 16 shows a configuration diagram of an SRAM cell according to a second embodiment of the present invention.

FIG. 16 shows a configuration diagram of an SRAM cell according to a second embodiment of the present invention. FIG. 16 shows an SRAM cell 300 having a plurality of bit lines and the corresponding number of pairs of control signal lines each corresponding to the respective bit line's, where the pair of control signal lines is configured by a single write control signal line and a single read control signal line. With the SRAM cell 300, a multi-port SRAM device can be configured. In other words, in the SRAM device configured by an array of the SRAM cells described above, while performing the read or write operation of each cell in a certain row direction (word direction), the similar operation can be performed simultaneously in the cells of other row directions. Here, the pairs of control lines are commonly used for the SRAM cells arranged in the same row direction, while the plurality of bit lines are commonly used for the SRAM cells arranged in the same column direction. Different rows utilize different pairs of the control lines and different column utilizes the plurality of bit lines different from each other. However, the operation effects in the same way.

FIG. 16 shows the SRAM cell 300 having two bit lines BL1 and BL2 shared in the column direction and two pairs of control signal lines, a first pair of control signal lines corresponding to the bit line BL1 and including a write control signal line WWL1 and a read control signal line RWL1 shared in the row direction, and a second pair of control signal lines corresponding to the bit line BL2 and including a write control signal line WWL2 and a read control signal line RWL2.

A first inverter 302 is configured by a PMOST 310 and an NMOST 312 having each drain connected to form an output signal node Q302, each gate electrode to form an input signal node I302, a source of the PMOST 310 to a power supply line VDDL, and a source of the NMOST 312 to a power feedback line VSSL. Similarly, a second inverter 304 is configured by a PMOST 314 and an NMOST 316 having each drain connected to form an output signal node Q304, each gate electrode to form an input signal node I304, a source of the PMOST 314 to a power supply line VDDL, and a source of the NMOST 316 to a power feedback line VSSL.

The output signal node Q302 of the first inverter 302 is connected to the input signal node I304 of the second inverter 304. The output signal node Q304 of the second inverter 304 and the input signal node I302 of the first inverter 302 are connected through PMOSTs 320 and 322 which are two serial-connected feedback control transistors.

In addition, for each of the write control signal lines WWL1 and WWL2 belonging to a pair of control signal lines, NMOSTs 330 and 332 serving as write control transistors are prepared to have each source connected to the input signal node I302 of the first inverter 302 and each drain to the corresponding bit lines BL1 and BL2, respectively. Moreover, for the read control signal lines RWL1 and RWL2, NMOSTs 334 and 336 serving as read control transistors as well as NMOSTs 324 and 326 serving as buffer transistors are prepared. The NMOSTs 334 and 336 have sources each connected to drains of the NMOSTs 324 and 326, respectively, and drains each connected to the corresponding bit lines BL1 and BL2, respectively. The NMOSTs 334 and 336 have gates each connected to the corresponding read control signal lines RWL1 and RWL2, respectively. Furthermore, gates of the PMOSTs 320 and 322 are connected to the write control signal lines WWL1 and WWL2, respectively.

Next, the operations of the SRAM cell 300 under control of a control circuit 340 will be described schematically. When either of the write control signal lines WWL1 and WWL2 is selected, i.e. either of them is set to the high potential, the potential of the corresponding bit line BL1 or BL2 is transferred to the input signal node I302 of the first inverter 302. At this time, the corresponding PMOST 320 or 322 is switched to the non-conducted state and thus the positive feedback circuit is disconnected, so that the write operation is performed as with the first embodiment. Concurrent selection of two or more write control signal lines connected to the same SRAM cell must be inhibited because it impairs the normal operation. The SRAM cells arranged in different rows can perform the write operation simultaneously.

The read operation is performed by selecting either or both read control signal lines, i.e. by setting the potential to the high level, as with the first embodiment. At this time, the bit lines involved in the read operation are of course set to the appropriate potential level. In the read operation, two or more read control signal lines connected to the same SRAM cell can be selected concurrently. In addition, the SRAM cells arranged in different rows can perform the read operation simultaneously. However, different bit lines should be used. It is also possible, for each of the SRAM cells arranged in different rows, the cell in a certain row performs the write operation while the cell in a different row performs the read operation.

As described above, for the SRAM cells according to the present invention arranged in different rows, each of the bit lines can be used in various combinations of the read and write operations. Of course, the bit line used for the read operation and that for the write operation must be different from each other.

In the holding status, the SRAM cell is disconnected from each bit line. However, it is connected when the NMOST is in the non-conducted state, so that the leak current may flow. Although, the cell is disconnected in terms of the fact that the memory contents are not inverted due to the change in the potential of the bit lines.

In addition, two feedback control transistors PMOSTs 320 and 322 are in the conducted state to configure the positive feedback circuit.

In the embodiment shown in FIG. 16, the NMOSTs 324 and 326 serving as buffer transistors can be replaced with a single common buffer transistor having the same size and structure. However, when reading out the memory contents simultaneously to a plurality of bit lines, if not occur frequently, the resistance of the buffer transistor on the discharging passage is multiplied by the number of the bit lines in the worst cases, resulting in the decrease in the speed of the read operation. As long as the decrease in the speed is acceptable, using a common buffer transistor may contribute to mitigate the increase in the area when realizing the SRAM cell. If the above-described case occurs at a considerable frequency, the embodiment shown in FIG. 16 is effective.

Figure 17:
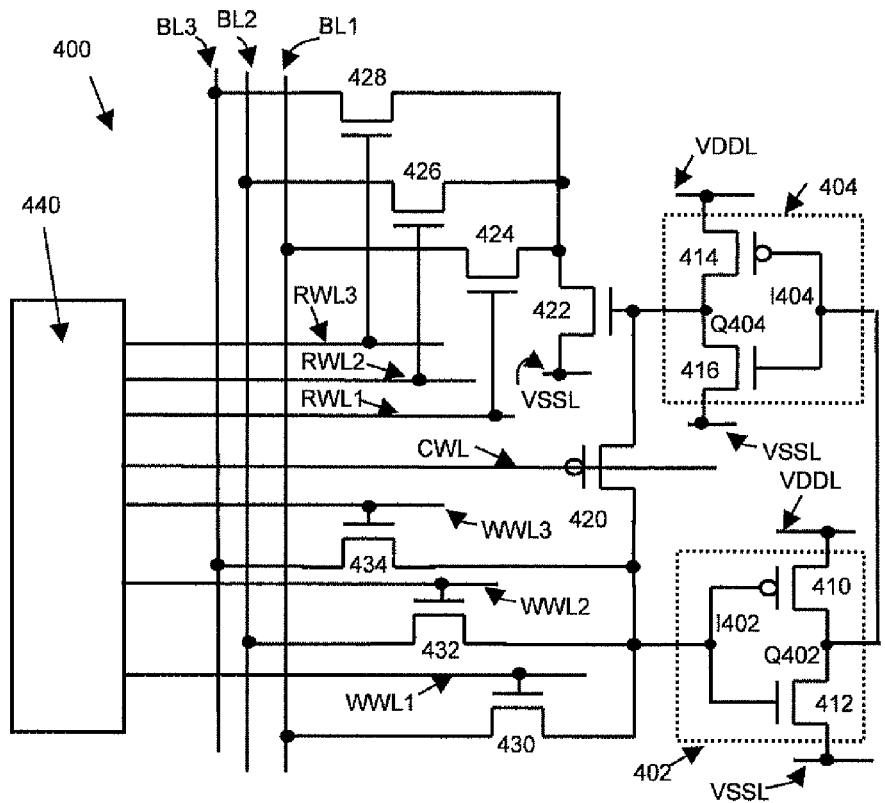
FIG. 17 shows a configuration diagram of an SRAM cell according to a third embodiment of the present invention.

FIG. 17 shows a configuration diagram of an SRAM cell according to a third embodiment of the present invention. FIG. 17 shows the case where the SRAM cell has three bit lines. An SRAM cell 400 in FIG. 17 has three bit lines BL1, BL2, and BL3, pairs of control signal lines (WWL1, RWL1), (WWL2, RWL2), and (WWL3, RWL3) each corresponding to the respective bit lines, and a single feedback control signal line CWL, where the pair of control signal lines is configured by a single write control signal line and a single read control signal line. A control circuit 440 outputs appropriate signals to each component of each pair of the control signal lines described above.

A first inverter 402 is configured by a PMOST 410 and an NMOST 412, having an input signal node I402 and an output signal node Q402. Similarly, a second inverter 404 is configured by a PMOST 414 and an NMOST 416, having an input signal node I404 and an output signal node Q404. The output signal node Q402 of the first inverter 402 and the input signal node I404 of the second inverter 404 are connected with each other. The output signal node Q404 of the second inverter 404 and the input signal node I402 of the first inverter 402 are connected through a PMOST 420 serving as a single feedback control transistor, and a gate of the PMOST 420 is connected to the feedback control signal line CWL. In addition, the output signal node Q404 of the second inverter 404 is connected to a gate of an NMOST 422 serving as a single buffer transistor, and a source of the NMOST 422 is connected to a power feedback line VSSL. A drain of the NMOST 422 is connected to each source of NMOSTs 424, 426, and 428 serving as read control transistors. Each drain of the NMOSTs 424, 426, and 428 is connected to the bit lines BL1, BL2, and BL3, respectively, and each gate thereof is connected to the read control signal lines RWL1, RWL2, and RWL3, respectively, which are the components of the pairs of control signal lines each corresponding to the respective bit lines. The input signal node I402 of the first inverter 402 is connected to each source of the NMOSTs 430, 432, and 434 serving as write control transistors, each drain thereof is connected to the bit lines BL1, BL2, and BL3, respectively, and each gate thereof is connected to the write control signal lines WWL1, WWL2, and WWL3, respectively, which are the components of the pairs of control signal lines corresponding to the respective bit lines.

Only when the write operation is selected, the potential of the feedback control signal line CWL is set to the high potential to switch the PMOST 420 to the non-conducted state. In other cases, it is switched to the conducted state so that the positive feedback circuit is established between the first inverter 402 and the second inverter 404. Logically, the signal of the feedback control signal line CWL may be a logical sum of the signals of the write control signal lines WWL1, WWL2, and WWL3. Although the PMOST may be replaced with the NMOST, the signal of the feedback control signal line CWL would be the inversion of the above in that case.

In FIG. 17, the number of transistors is reduced by using a single feedback control transistor and instead a single feedback control signal line is arranged, so that the gate of the feedback control transistor is applied with a control signal from the feedback control signal line to switch the transistor to the non-conducted state in the write operation. Moreover, the buffer transistor is shared to mitigate the increase in the number of transistors.

Although the above embodiment describes the case where three bit lines are used, the number thereof may be two or otherwise more than three. When more than three bit lines are used, it is sufficient to use two more transistors per one additional bit line. Therefore, in realizing the SRAM storage device as an integrated circuit, the increase in the area can be reduced for the increase in the number of bit lines of the SRAM cell.

Figure 18:
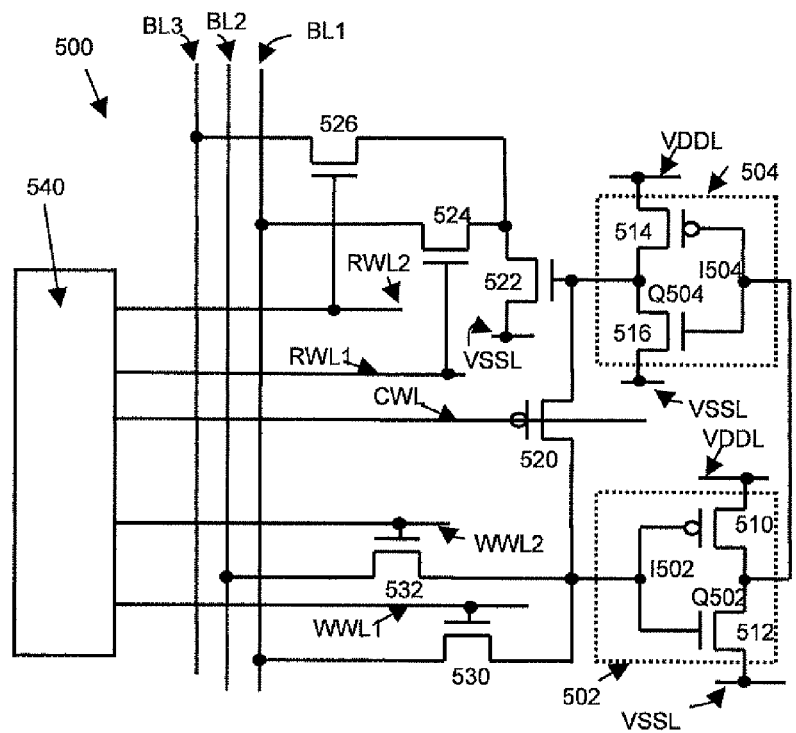
FIG. 18 shows a configuration diagram of an SRAM cell according to a fourth embodiment of the present invention.

FIG. 18 shows a configuration diagram of an SRAM cell according to a fourth embodiment of the present invention. A first inverter 502 is configured by a PMOST 510 and an NMOST 512, having an input signal node I502 and an output signal node Q502. Similarly, a second inverter 504 is configured by a PMOST 514 and an NMOST 516, having an input signal node I504 and an output signal node Q504. The output signal node Q502 of the first inverter 502 and the input signal node I504 of the second inverter 504 are connected with each other. The output signal node Q504 of the second inverter 504 and the input node I502 of the first inverter 502 are connected through a PMOST 520 serving as a single feedback control transistor, and a gate of the PMOST 520 is connected to a feedback control signal line CWL. In addition, the output signal node Q504 of the second inverter 504 is connected to a gate of an NMOST 522 serving as a single buffer transistor, and a source of the NMOST 522 is connected to a power feedback line VSSL. A drain of the NMOST 522 is connected to each source of NMOSTs 524 and 526 serving as read control transistors. Each drain of the NMOSTs 524 and 526 is connected to bit lines BL1 and BL3, respectively, and each gate thereof is connected to read control signal lines RWL1 and RWL2, respectively, which correspond to the respective bit lines. The input signal node I502 of the first inverter 502 is connected to each source of NMOSTs 530 and 532 serving as write control transistors, each drain thereof is connected to the bit lines BL1 and BL2, respectively, and each gate thereof is connected to write control signal lines WWL1 and WWL2, respectively, which correspond to the respective bit lines.

Only when the write operation is selected, the potential of the feedback control signal line CWL is set to the high potential to switch the PMOST 520 to the non-conducted state. In other cases, it is switched to the conducted state so that the positive feedback circuit is established between the first inverter 502 and the second inverter 504.

Here, there are a single bit line BL1 and the corresponding pair of control signal lines (WWL1, RWL1), while the bit line BL2 is for write-only and the bit line BL3 is for the read-only. The bit line BL2 corresponds to a single write control line WWL2 and the bit line BL3 corresponds to a single read control line RWL2. In this case, as compared to the embodiment shown in FIG. 17, the number of write control signal lines and the corresponding write control transistors can be reduced, or the number of read control signal lines and the corresponding read control transistors can be reduced, so that the increase in the area can be reduced for the increase in the number of bit lines. Also in that case, at least one bit line can be used for both of the write and read operations. Therefore, flexible functions as a storage device can be realized, such as the combination of two bit lines used for the write operation and one bit line for the read operation, the combination of one bit line for the write operation and two bit lines for the read operation, or the like, depending on the target functions of the storage device.

Figure 19:
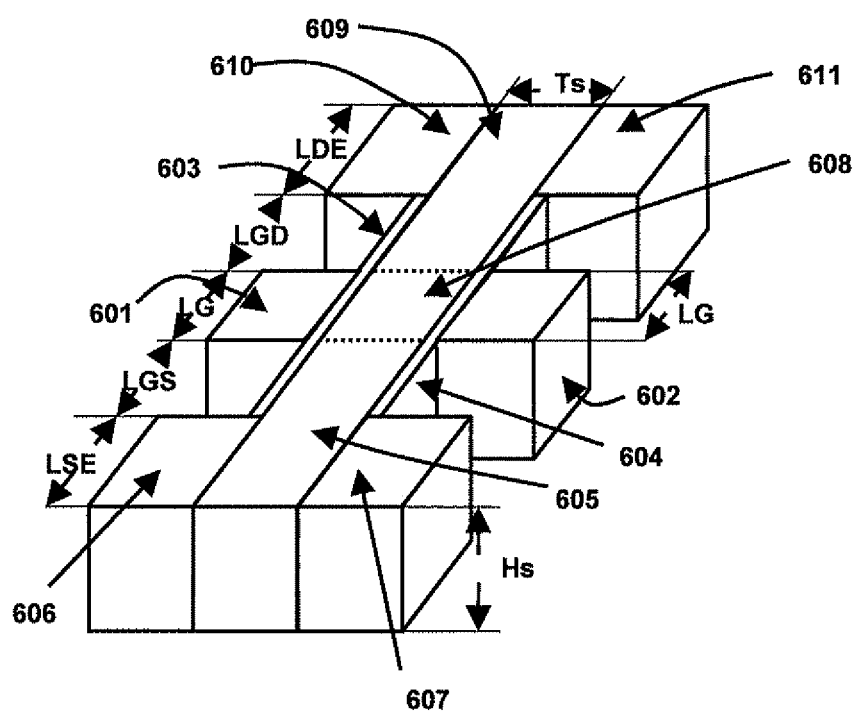
FIG. 19 shows a perspective view of a double insulated gate field effect transistor having a fin structure used as each transistor in the present invention.

In the simulations of the present invention described above, each transistor employs double insulated gate field effect transistors having a fin structure, that are connected commonly at the gate electrodes for three-terminal operation, as shown in a schematic diagram of FIG. 19.

In FIG. 19, reference numeral 601 denotes a first gate electrode, 602 denotes a second gate electrode, 603 denotes a first gate oxide, 604 denotes a second gate oxide, 605 denotes a source region, 606 denotes a first electrode of the source region 605, 607 denotes a second electrode of the source region 605, 608 denotes a channel region, 609 denotes a drain region, 610 denotes a first electrode of the drain region 609, and 611 denotes a second electrode of the drain region 609. Each electrode mentioned above is arranged on the side of a semiconductor layer having a fin structure (the semiconductor layer with the rectangular cross-section, configured by 605, 608, and 609), and each serves as the so-called radiator fin to provide cooling effect or a wider heat-transfer area.

Figure 1:
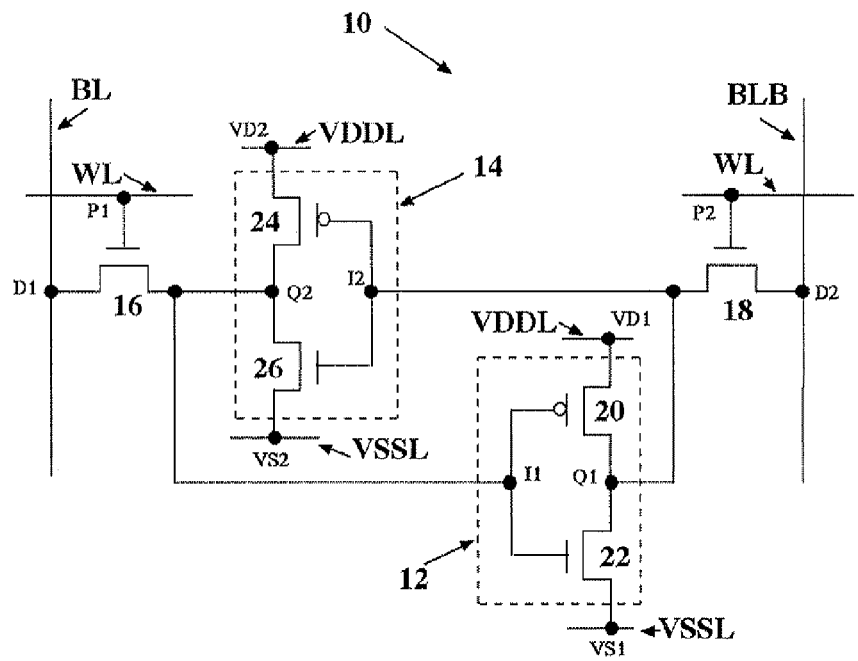
FIG. 1 shows a configuration diagram of a conventional dual bit line SRAM cell.
Figure 2:
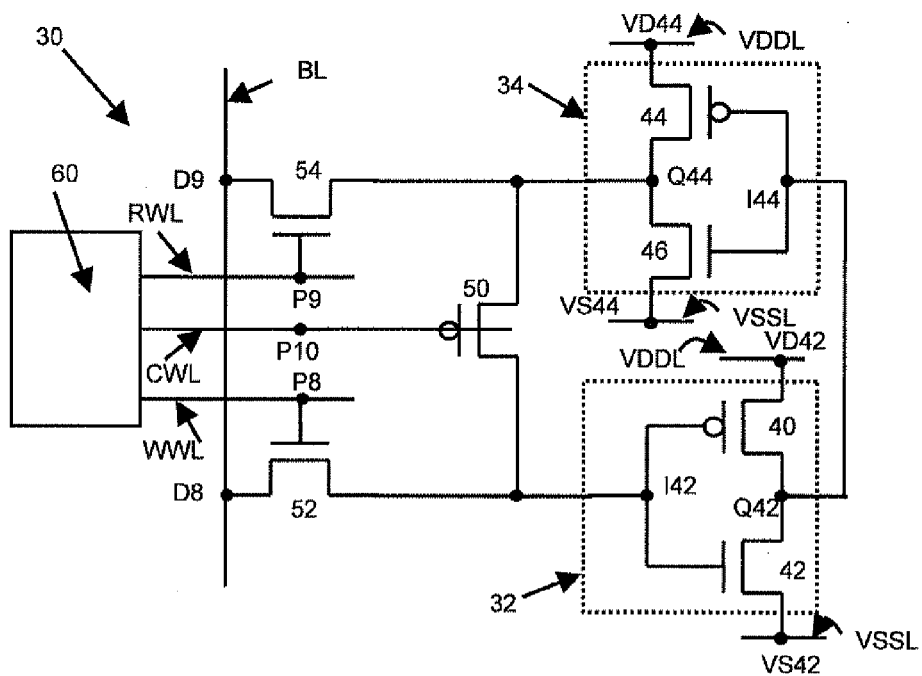
FIG. 2 shows a configuration diagram of a conventional single bit line SRAM cell which can be commonly used in read and write operations.
Figure 3:
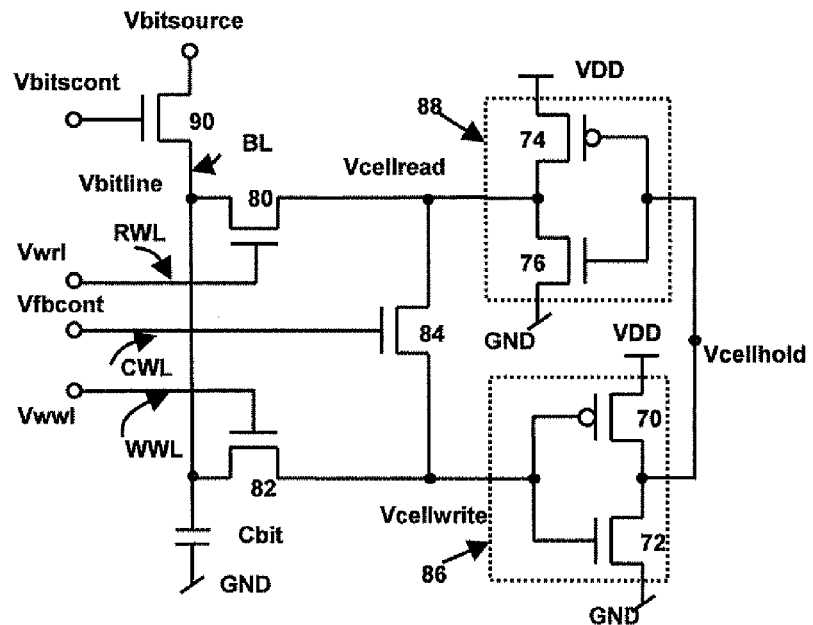
FIG. 3 shows a configuration diagram of the conventional SRAM cell without the size constraints imposed on each transistor configuring the SRAM cell.

The gate electrodes 601 and 602 have the length of 50 nm, the fin thickness of 10 nm, and the fin height of 100 nm. In the three-terminal operation, twice of the fin height corresponds to the so-called channel width. For more rapid change in the bit line potential, the fin height for the NMOSTs such as 90 in FIG. 3 and 240 in FIG. 11 are made to be five times by design. This can be realized by connecting five other used NMOSTs having the same structure in parallel, for example. Table 9 shows constants such as the size of the MOS transistor used in the simulations. Here, the SRAM cell provides the voltage VDD, 0.7 V, for the power supply line and the voltage VSS, 0.0 V, for the power feedback line.

TABLE 9

Figure 4:
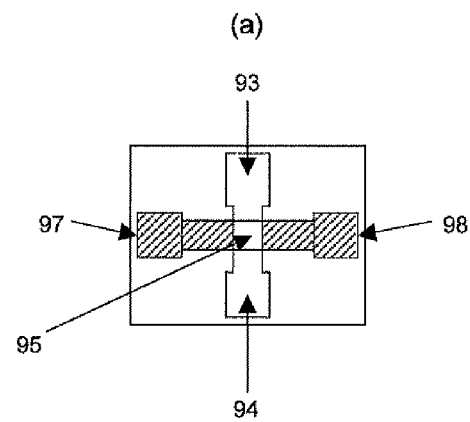
FIG. 4 shows a schematic diagram of a conventional double insulated gate field effect transistor having a fin structure and two independent gate electrodes.
Figure 4:
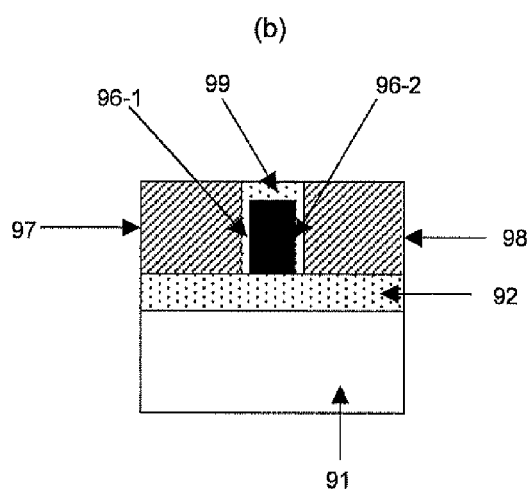
Figure 5:
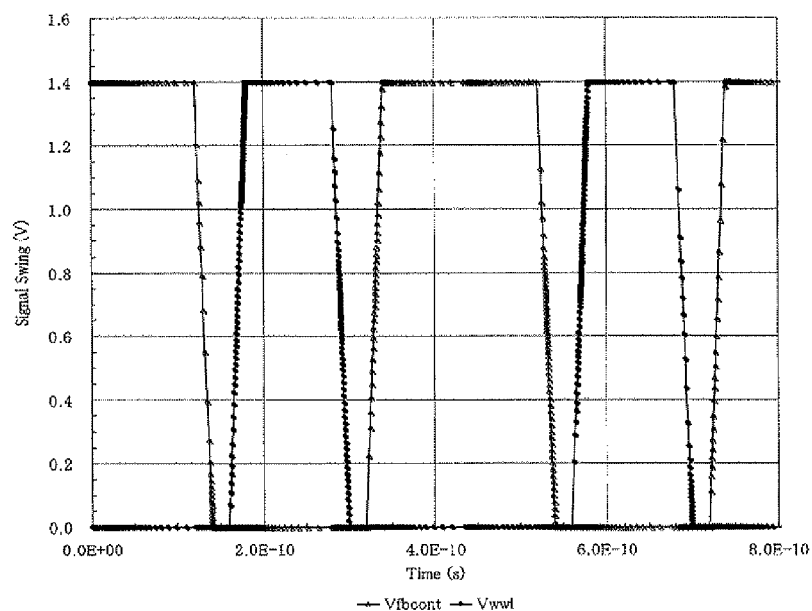
FIG. 5 shows a diagram of a control signal waveform of the write operation as the simulation result in the write operation of the conventional SRAM cell.
Figure 6:
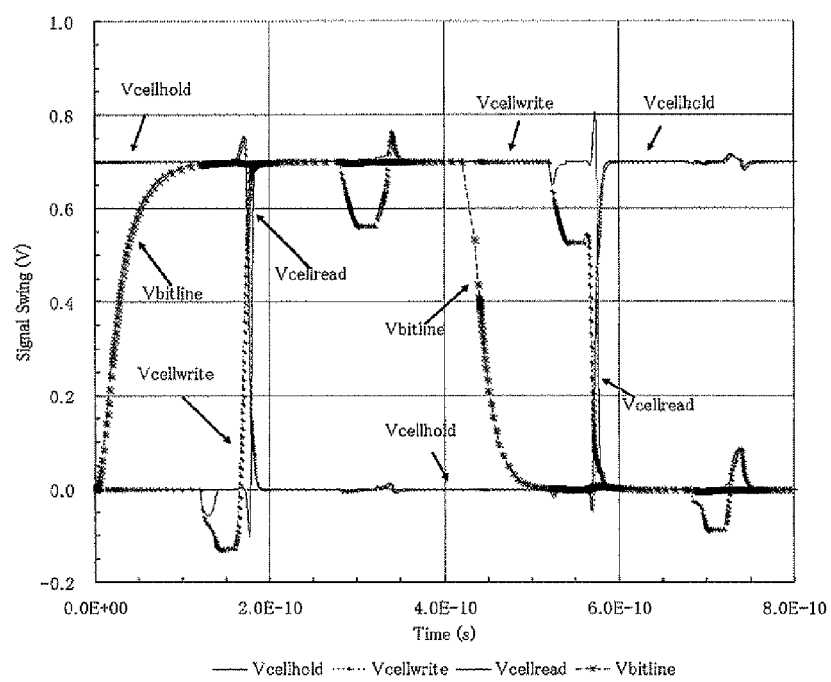
FIG. 6 shows a signal waveform of each node of the SRAM cell as the simulation result in the write operation of the conventional SRAM cell.
Figure 7:
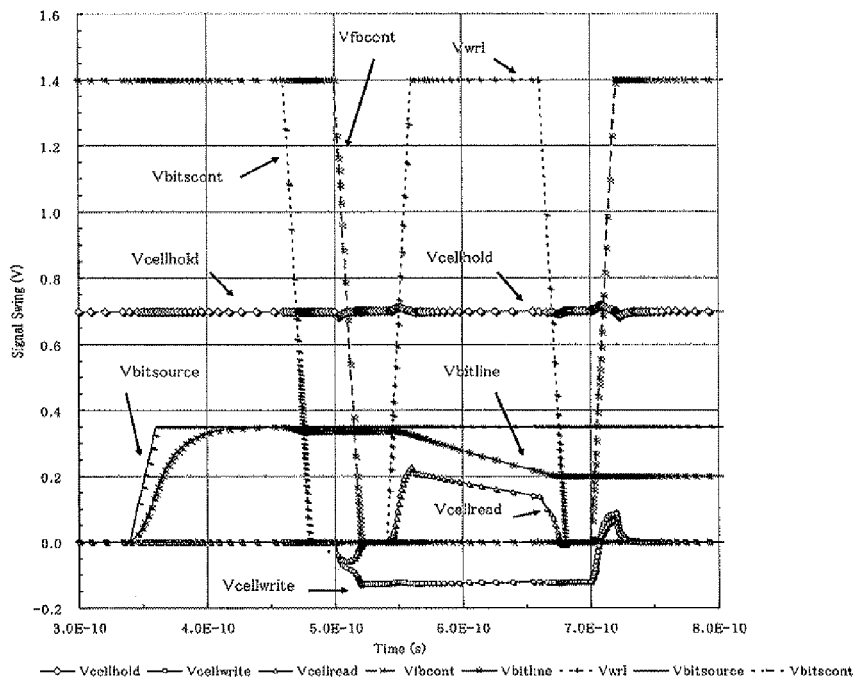
FIG. 7 shows a signal waveform of each node when reading the memory contents held at the low level from the conventional SRAM cell in FIG. 2.
Figure 8:
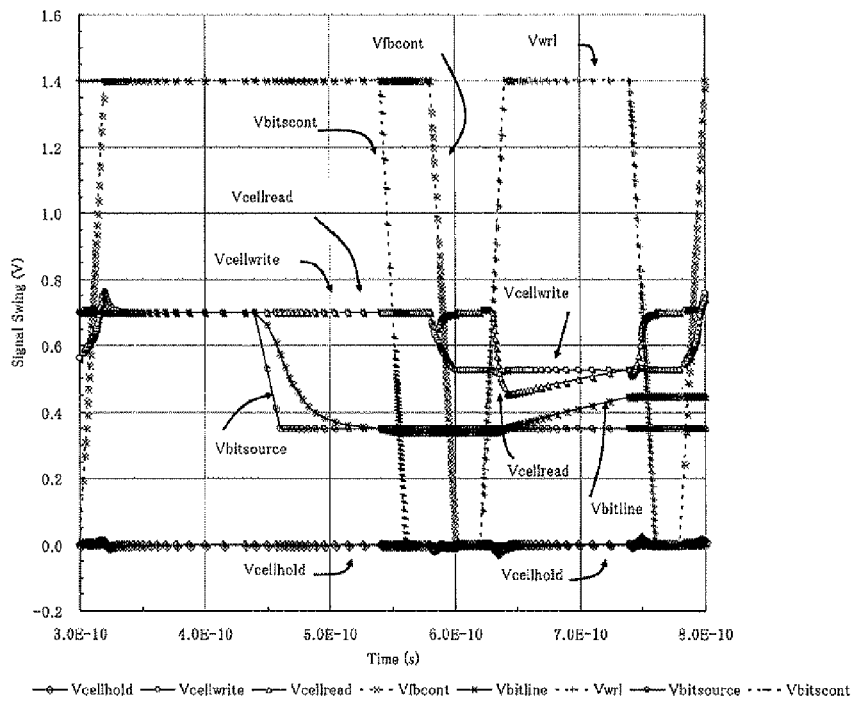
FIG. 8 shows a signal waveform of each node when reading the memory contents held at the high level from the conventional SRAM cell in FIG. 2.
Figure 9:
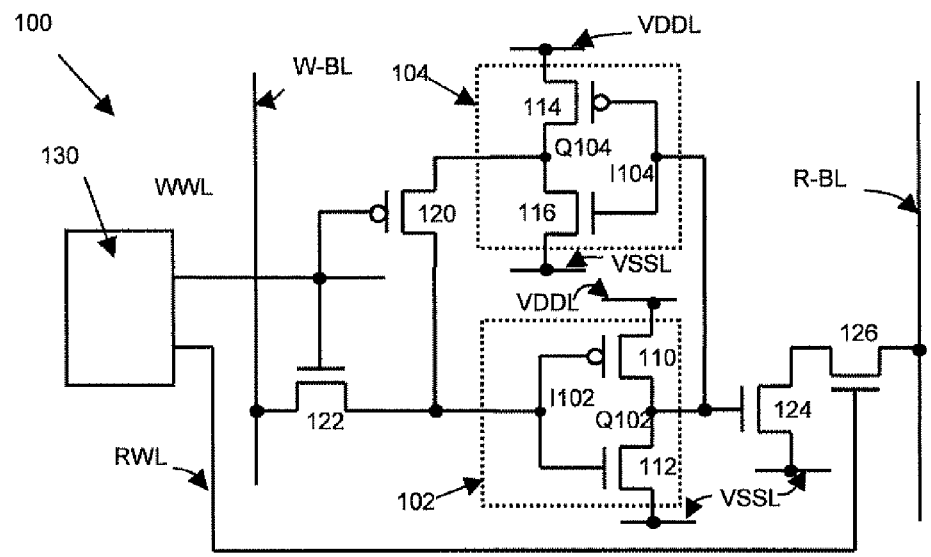
FIG. 9 shows a configuration diagram of the conventional SRAM cell additionally including a read buffer configured by a read control transistor and a buffer transistor as well as a read-only bit line.

LG: Gate Length: 50 nm
Ts: Thickness of Silicon Layer Between Gates (Fin Thickness): 10 nm
Gate Oxide 1: First Gate Oxide, 1.5 nm in Thickness
Gate Oxide 2: Second Gate Oxide, 1.5 nm in Thickness
Gate 1: First Gate Electrode
Gate 2: Second Gate Electrode
Hs: Silicon Fin Height, 100 nm
LSE: Length of Source Electrode, 100 nm
LDE: Length of Drain Electrode, 100 nm
LGS: Distance Between Gate Electrode and Source Electrode, 50 nm
LGD: Distance Between Gate Electrode and Drain Electrode, 50 nm
Source: Source Region
Drain: Drain Region
Low-Field Electron Mobility: 350 cm$^2$/V/s
Low-Field Hole Mobility: 150 cm$^2$/V/s
NMOST Threshold Voltage: Approx. 0.25 V
PMOST Threshold Voltage: Approx. −0.25 V Particularly, for the so-called double insulated gate field effect transistor having a fin structure (two gate electrodes are formed integrally on both sides of a channel or electrically separated as shown in FIG. 4), where it is configured in crystal silicon on an insulating layer on a substrate and the current flows in parallel with the substrate, as disclosed in Patent Documents 3 and 4 listed above, the channel width is determined depending on the fin height which is difficult to vary for each transistor.

However, by applying the present invention in configuring the SRAM cells using such double insulated gate field effect transistors having a fin structure, they can be configured with the same channel width, so that high-performance storage devices can be configured with easier process.

What is claimed is:

1. An SRAM cell, comprising:
a single bit line;
a pair of control signal lines corresponding to the bit line and including a single write control signal line and a single read control signal line;
a feedback control transistor;
a write control transistor, a read control transistor, and a buffer transistor having an inverse polarity of the feedback control transistor;
a first inverter having an output signal node and an input signal node; and
a second inverter having an output signal node and an input signal node; wherein the first and second inverters operate by each connecting with a power supply line and a power feedback line, the output signal node of the first inverter is connected to the input signal node of the second inverter, the output signal node of the second inverter and the input signal node of the first inverter are connected through the feedback control transistor, the input signal node of the first inverter and the bit line are connected through the write control transistor, each gate of the feedback control transistor and the write control transistor is connected to the write control signal line, a gate of the buffer transistor is connected to the output signal node of the second inverter, which is connected to the feedback control transistor, a source of the buffer transistor is connected to the power feedback line, a drain of the buffer transistor and the bit line are connected through the read control transistor, and a gate of the read control transistor is connected to the read control signal line.

2. The SRAM cell according to claim 1, wherein the first and second inverters are configured by a P-type field effect transistor and an N-type field effect transistor.

3. The SRAM cell according to claim 2, wherein each transistor is a double insulated gate field effect transistor having a fin structure, connected commonly at two gate electrodes for three-terminal operation.

4. The SRAM cell according to claim 1, wherein the feedback control transistor is configured by a P-type field effect transistor, and the buffer transistor, the write control transistor, and the read control transistor are configured by an N-type field effect transistor.

5. The SRAM cell according to claim 4, wherein each transistor is a double insulated gate field effect transistor having a fin structure, connected commonly at two gate electrodes for three-terminal operation.

6. An SRAM cell, comprising:
a plurality of bit lines;
a plurality of pairs of control signal lines, the number of the pairs corresponding to the number of the bit lines, each pair including a single write control signal line and a single read control signal line;
a plurality of groups of transistors, the number of the group corresponding to the bit lines, each group including a feedback control transistor, as well as a write control transistor, a read control transistor, and a buffer transistor having an inverse polarity of the feedback control transistor;
a first inverter having an output signal node and an input signal node; and
a second inverter having an output signal node and an input signal node; wherein
the first and second inverters operate by each connecting with a power supply line and a power feedback line,
the output signal node of the first inverter is connected to the input signal node of the second inverter, the output signal node of the second inverter and the input signal node of the first inverter are connected through a serial connection of all of the feedback control transistors, the input signal node of the first inverter and the bit lines are connected through the corresponding write control transistors,
each gate of the feedback control transistors and the write control transistors is connected to the corresponding write control signal lines,
each gate of the buffer transistors is connected to the output signal node of the second inverter, each source of the buffer transistors is connected to the power feedback line, each drain of the buffer transistors and the corresponding bit lines are connected through the corresponding read control transistors, and each gate of the read control transistors is connected to the corresponding read control signal lines.

7. The SRAM cell according to 6, wherein the first and second inverters are configured by a P-type field effect transistor and an N-type field effect transistor.

8. The SRAM cell according to claim 7, wherein each transistor is a double insulated gate field effect transistor having a fin structure, connected commonly at two gate electrodes for three-terminal operation.

9. The SRAM cell according to claim 6, wherein the feedback control transistor is configured by a P-type field effect transistor, and the buffer transistor, the write control transistor, and the read control transistor are configured by an N-type field effect transistor.

10. The SRAM cell according to claim 9, wherein each transistor is a double insulated gate field effect transistor having a fin structure, connected commonly at two gate electrodes for three-terminal operation.

11. An SRAM cell, comprising:
a plurality of bit lines;
a plurality of pairs of control signal lines, the number of the pairs corresponding to the number of the bit lines, each pair including a single write control signal line and a single read control signal line;
a single feedback control line;
a feedback control transistor;
a buffer transistor;
a plurality of groups of transistors, the number of the group corresponding to the bit lines, each group including a write control transistor and a read control transistor having an inverse polarity of the feedback control transistor;
a first inverter having an output signal node and an input signal node; and
a second inverter having an output signal node and an input signal node; wherein
the first and second inverters operate by each connecting with a power supply line and a power feedback line,
the output signal node of the first inverter is connected to the input signal node of the second inverter, the output signal node of the second inverter and the input signal node of the first inverter are connected through the feedback control transistor,
a gate of the feedback control transistor is connected to the feedback control line,
the input signal node of the first inverter and each of the bit lines are connected through the corresponding write control transistors, and
a gate of the buffer transistor is connected to the output signal node of the second inverter, a source of the buffer transistor is connected to the power feedback line, a drain of the buffer transistor and each of the bit lines are connected through the corresponding read control transistors, each gate of the read control transistors is connected to each read control signal line of the corresponding pair of control signal lines.

12. The SRAM cell according to claim 11, wherein the first and second inverters are configured by a P-type field effect transistor and an N-type field effect transistor.

13. The SRAM cell according to claim 12, wherein each transistor is a double insulated gate field effect transistor having a fin structure, connected commonly at two gate electrodes for three-terminal operation.

14. The SRAM cell according to claim 11, wherein the feedback control transistor is configured by a P-type field effect transistor, and the buffer transistor, the write control transistor, and the read control transistor are configured by an N-type field effect transistor.

15. The SRAM cell according to claim 14, wherein each transistor is a double insulated gate field effect transistor having a fin structure, connected commonly at two gate electrodes for three-terminal operation.

16. An SRAM cell, comprising:
a plurality of bit lines;
a pair of control signal lines, corresponding to at least one bit line among the bit lines, including a single write control signal line and a single read control signal line;
a write control signal line or a read control signal line corresponding to the other bit lines;
a single feedback control line;
a feedback control transistor;
write control transistors corresponding to the write control signal lines;
read control transistors corresponding to the read control signal lines;
a buffer transistor;
a first inverter having an output signal node and an input signal node; and
a second inverter having an output signal node and an input signal node; wherein
the first and second inverters operate by each connecting with a power supply line and a power feedback line,
the output signal node of the first inverter is connected to the input signal node of the second inverter, the output signal node of the second inverter and the input signal node of the first inverter are connected through the feedback control transistor,
a gate of the feedback control transistor is connected to the feedback control line,
the input signal node of the first inverter is connected to the bit lines through the corresponding write control transistors,
each gate of the write control transistors is connected to the corresponding write control signal line,
a gate of the buffer transistor is connected to the output signal node of the second inverter, a source of the buffer transistor is connected to the power feedback line, a drain of the buffer transistor is connected to the bit lines through the corresponding read control transistors, and
each gate of the read control transistors is connected to the corresponding read control signal lines.

17. The SRAM cell according to claim 16, wherein the first and second inverters are configured by a P-type field effect transistor and an N-type field effect transistor.

18. The SRAM cell according to claim 17, wherein each transistor is a double insulated gate field effect transistor having a fin structure, connected commonly at two gate electrodes for three-terminal operation.

19. The SRAM cell according to claim 16, wherein the feedback control transistor is configured by a P-type field effect transistor, and the buffer transistor, the write control transistor, and the read control transistor are configured by an N-type field effect transistor.

20. The SRAM cell according to claim 19, wherein each transistor is a double insulated gate field effect transistor having a fin structure, connected commonly at two gate electrodes for three-terminal operation.

\* \* \* \* \*